(12) United States Patent
Chung et al.

(10) Patent No.: US 12,191,145 B2
(45) Date of Patent: Jan. 7, 2025

(54) SEMICONDUCTOR DEVICE AND FORMATION METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Chia-Che Chung, Hsinchu (TW); Chia-Jung Tsen, Taoyuan (TW); Chee-Wee Liu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 193 days.

(21) Appl. No.: 17/834,596

(22) Filed: Jun. 7, 2022

(65) Prior Publication Data

US 2023/0395379 A1 Dec. 7, 2023

(51) Int. Cl.
*H01L 21/02* (2006.01)
*H01L 21/47* (2006.01)

(52) U.S. Cl.
CPC .. *H01L 21/02697* (2013.01); *H01L 21/02112* (2013.01); *H01L 21/02263* (2013.01); *H01L 21/47* (2013.01)

(58) Field of Classification Search
CPC ............... H01L 29/785–7856; H01L 29/0653
See application file for complete search history.

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 2013/0020707 A1* | 1/2013 | Or-Bach | H01L 29/792 257/E23.011 |

(Continued)

OTHER PUBLICATIONS

Chui et al., "A Cost Model Analysis Comparing Via-Middle and Via-Last TSV Processes", 2015 IEEE 17th Electronics Packaging and Technology Conference (EPTC), pp. 1-4.

(Continued)

*Primary Examiner* — Erik Kielin
(74) *Attorney, Agent, or Firm* — Birch, Stewart, Kolasch & Birch, LLP

(57) ABSTRACT

A method of forming a semiconductor device includes forming a semiconductor strip extending above a semiconductor substrate, forming shallow trench isolation (STI) regions on opposite sides of the semiconductor strip, recessing a portion of the semiconductor strip, etching the STI regions to form a recess in the STI regions, forming a first thermal conductive layer in the recess, forming a source/drain epitaxy structure on the first thermal conductive layer, and forming a gate stack across the semiconductor strip and extending over the STI regions.

20 Claims, 43 Drawing Sheets

(56) References Cited

U.S. PATENT DOCUMENTS

| | | | | |
|---|---|---|---|---|
| 2015/0311138 A1* | 10/2015 | Lee | .................. | H01L 29/518 257/347 |
| 2016/0118245 A1* | 4/2016 | Huang | .................. | H01L 29/12 438/151 |
| 2016/0247726 A1* | 8/2016 | Huang | .................. | H01L 21/3065 |
| 2016/0315146 A1* | 10/2016 | Jung | .................. | H01L 29/0847 |
| 2019/0164866 A1* | 5/2019 | Yan | .................. | H01L 29/41791 |
| 2024/0021728 A1* | 1/2024 | Yang | .................. | H01L 29/785 |

OTHER PUBLICATIONS

Hiblot et al., "Observation of Plasma-Induced Damage in Bulk Germanium p-Type FinFET Devices and Curing in High-Pressure Anneal", IEEE Transactions on Device and Materials Reliability, vol. 19, No. 2, Jun. 2019, pp. 468-470.

Huylenbroeck et al., "A Highly Reliable 1×5um Via-last TSV Module", 2018 IEEE International Interconnect Technology Conference (IITC), pp. 94-96.

Lee et al., "Advanced Silicon-on-Insulator: Crystalline Silicon on Atomic Layer Deposited Beryllium Oxide," Scientific Reports (Sci Rep) 7, 13205, Oct. 16, 2017, pp. 1-7.

Lee et al., "Growth of aluminum nitride thin films prepared by plasma-enhanced atomic layer deposition", Thin Solid Films, 2004, vol. 446, No. 2, pp. 227-231.

Li et al., "TSV Process-Induced MOS Reliability Degradation", 2018 IEEE International Reliability Physics Symposium (IRPS), pp. 5B.5-1-5B.5-5.

Loubet et al., "A Novel Dry Selective Etch of SiGe for the Enablement of High Performance Logic Stacked Gate-All-Around NanoSheet Devices", 2019 IEEE International Electron Devices Meeting (IEDM), 2019, pp. 11.4.1-11.4.4.

Loubet et al., "Stacked Nanosheet Gate-All-Around Transistor to Enable Scaling Beyond FinFET", 2017 Symposium on VLSI Technology Digest of Technical Papers, pp. T230-T231.

Redolfi et al., "Implementation of an Industry Compliant, 5×50μm, Via-Middle TSV Technology on 300mm wafers", 2011 IEEE 61st Electronic Components and Technology Conference (ECTC), 2011, pp. 1384-1388.

Salah, "TSV-based 3D Integration Fabrication Technologies: An overview," 2014, 9th International Design and Test Symposium (IDT), 2014, pp. 253-256.

Smith et al., "Mixed-size diamond seeding for low-thermal-barrier growth of CVD diamond onto GaN and AlN", Carbon, vol. 167, 2020, pp. 620-626.

Wietstruck et al., "Development of a Through-Silicon Via (TSV) Process Module for Multi-Project Wafer SiGe BiCMOS and Silicon Interposer", 2018 IEEE 68th Electronic Components and Technology Conference (ECTC), 2018, pp. 2267-2274.

Yum et al., "Atomic layer deposited beryllium oxide: Effective passivation layer for III-V metal/oxide/semiconductor devices", Journal of Applied Physics, 2011, vol. 109, 064101, pp. 1-4.

* cited by examiner

SEMICONDUCTOR DEVICE AND FORMATION METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
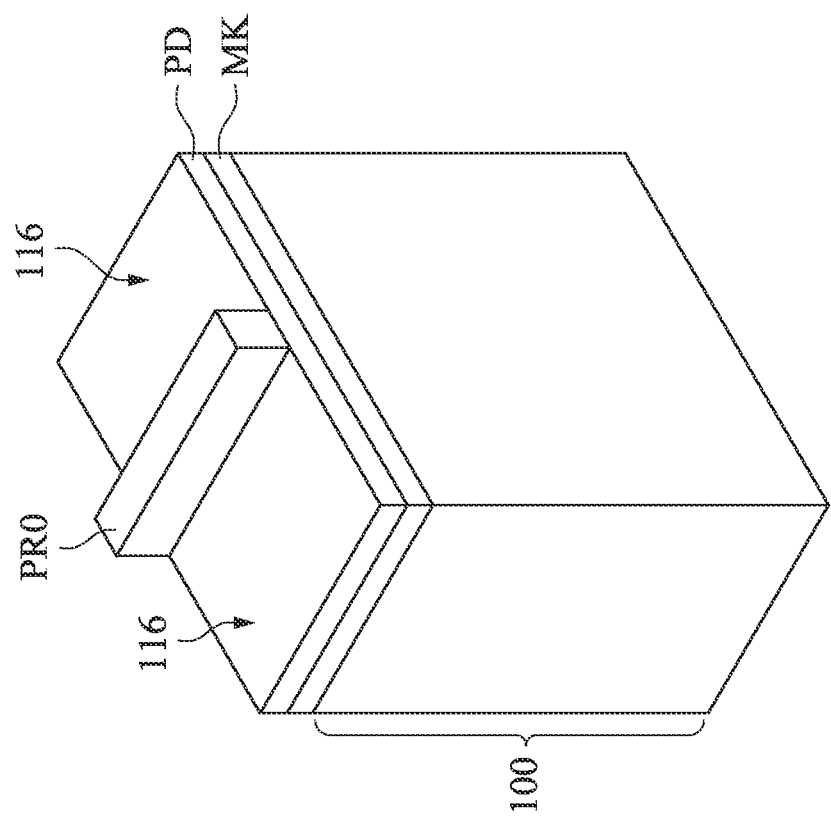
FIGS. 1, 2A, 3A, 4A, 5A, 6A, 7A, 8A, 9A, 10A, 11A, 12A, 13A, 14A and 15A are perspective views of the intermediate stages in the formation of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

In operation, current may not flow through the channel, and source/drain-to-substrate leakage may occur. Some existing transistor comes in forming silicon oxide materials at the source/drain region to prevent such leakage. However, silicon oxide materials have poor thermal conductivity. It may be difficult for heat generated by the source-to-drain current to dissipate into the substrate via the silicon oxide materials, resulting heat flowing towards channel, which has an effect on the performance and reliability of the transistor. In some cases, one or more anneal processes may be performed on the source/drain features to activate the dopants therein, which generates heat. The heat cannot dissipate into the substrate via the silicon oxide materials efficiently, leading to poor heat dissipation issues as well.

Therefore, embodiments of this disclosure provide a transistor having a thermal conductive layer at a source/drain region of the transistor. Heat generated by the source-to-drain current and/or the anneal process can be dissipated toward the substrate efficiently.

FIG. 1 is a perspective view of the semiconductor device 100 having a substrate 100 at one of various stages of fabrication according to an embodiment. In one embodiment, the substrate 100 includes a crystalline silicon substrate (e.g., wafer). In some alternative embodiments, the substrate 100 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 100 may include an epitaxial layer (epi-layer), may be strained for performance enhancement, and/or may include a silicon-on-insulator (SOI) structure.

In some embodiments, the substrate 100 includes various doped regions. The substrate 100 may include a well region depending on design requirements (e.g., p-type substrate or n-type substrate). In some embodiments, the well region may be doped with p-type or n-type dopants. For example, the well region may be doped with p-type dopants, such as boron or $BF_2$; n-type dopants, such as phosphorus or arsenic; and/or combinations thereof. The well region may be configured for an n-type fin field effect transistor (FinFET), or alternatively configured for a p-type FinFET. For an n-type filed effect (NFET) transistor, the well region should be doped with p-type dopants to form PN junctions. For a p-type filed effect (PFET) transistor, the well region should be doped with n-type dopants.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In one embodiment, a pad layer PD and a mask layer MK are formed on the substrate 100. The pad layer PD may be a thin film including silicon oxide formed, for example, using a thermal oxidation process. The pad layer PD may act as an adhesion layer between the substrate 100 and the mask layer MK. The pad layer PD may also act as an etch stop layer for etching the mask layer MK. In at least one embodiment, the mask layer MK is formed of silicon nitride, for example, using low-pressure chemical vapor deposition (LPCVD) or plasma enhanced chemical vapor deposition (PECVD). The mask layer MK is used as a hard mask during subsequent photolithography processes. A photo-sensitive layer PR0 is formed on the mask layer MK and is then patterned, forming openings 116 in the photo-sensitive layer PR0.

Figure 2A:
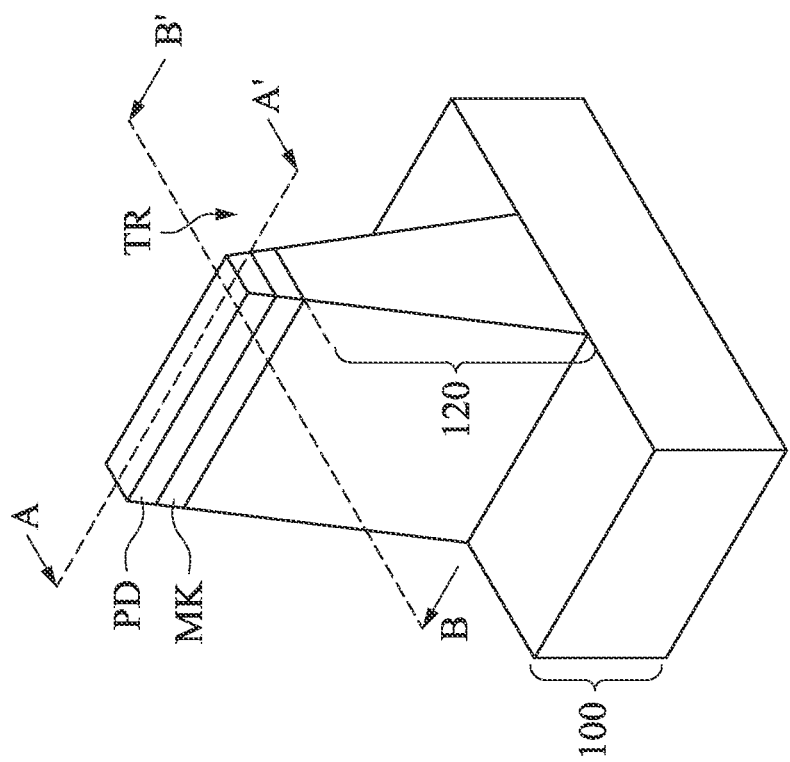
Figure 2C:
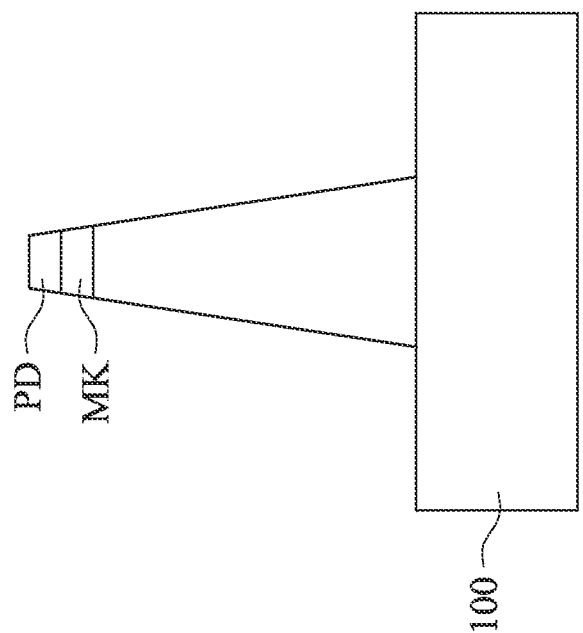
FIGS. 2C, 3C, 4C, 6C, 7C, 8C, 9C, 10C, 11C, 12C, 12D, 12E, 13C, 14C, 14D, 14E, and 15C are cross-sectional view taken along line B-B' of corresponding perspective views, respectively.
Figure 2B:
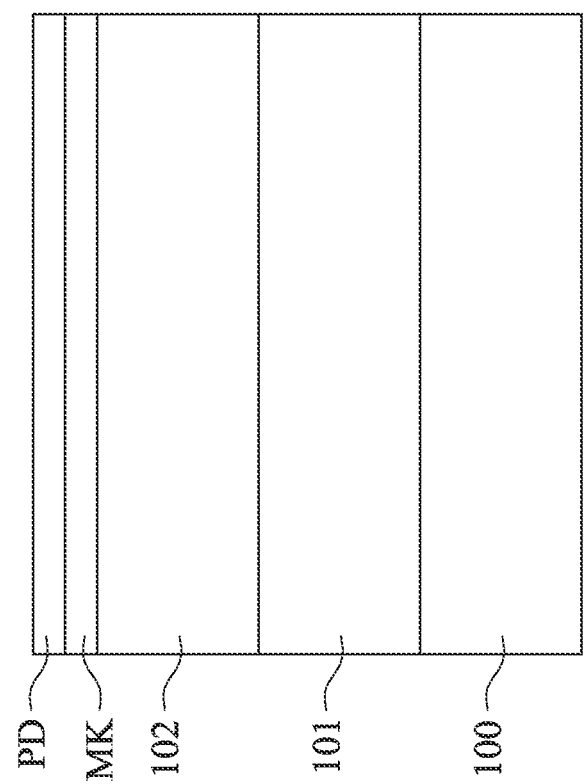
FIGS. 2B, 3B, 4B, 5B, 6B, 7B, 8B, 9B, 10B, 11B, 12B, 13B, 14B and 15B are cross-sectional views taken along line A-A' of corresponding perspective views, respectively.

The mask layer MK and the pad layer PD are etched through the openings 116 to expose the underlying substrate 100. The exposed substrate 100 is then etched to form trenches TR in the substrate 100, as illustrated in FIGS. 2A-2C. Portions of the substrate 100 between the trenches TR form strips 120. The trenches TR may be strips (viewed from in the top of the semiconductor device 100) parallel to each other, and closely spaced with respect to each other. The photo-sensitive layer PR0 is then removed, such as by an acceptable asking process. Next, a cleaning may be performed to remove a native oxide of the substrate 100. The cleaning may be performed using diluted hydrofluoric (DHF) acid. FIG. 2A further illustrates reference cross-sections that are used in later figures. Cross-section A-A' is along a longitudinal axis of the strip 120, which corresponds to FIG. 2B. Cross-section B-B' is perpendicular to cross-section A-A' and extends through a subsequently formed epitaxial source/drain regions of the FinFET, which corresponds to FIG. 2C.

Liner oxide (not shown) is then optionally formed in the trenches TR. In an embodiment, liner oxide may be a thermal oxide. In some embodiments, liner oxide may be formed using in-situ steam generation (ISSG) and the like. The formation of liner oxide rounds corners of the trenches TR, which reduces the electrical fields, and hence improves the performance of the resulting integrated circuit.

Figure 3A:
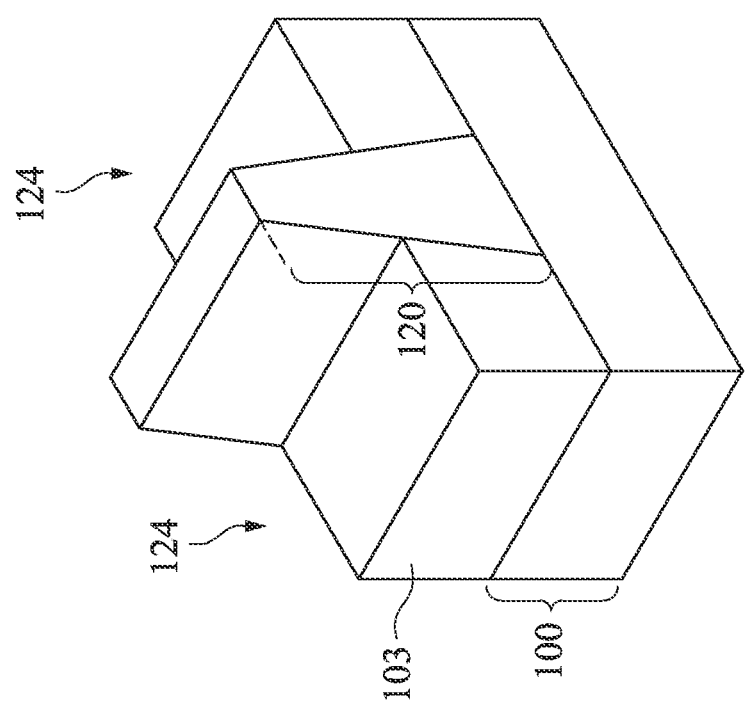
Figure 3C:
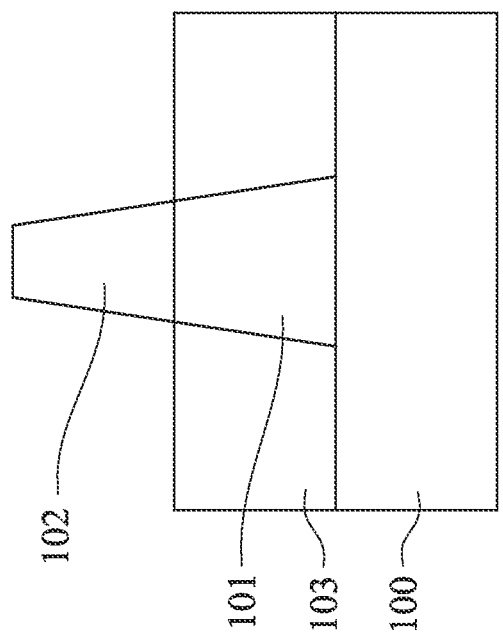
Figure 3B:
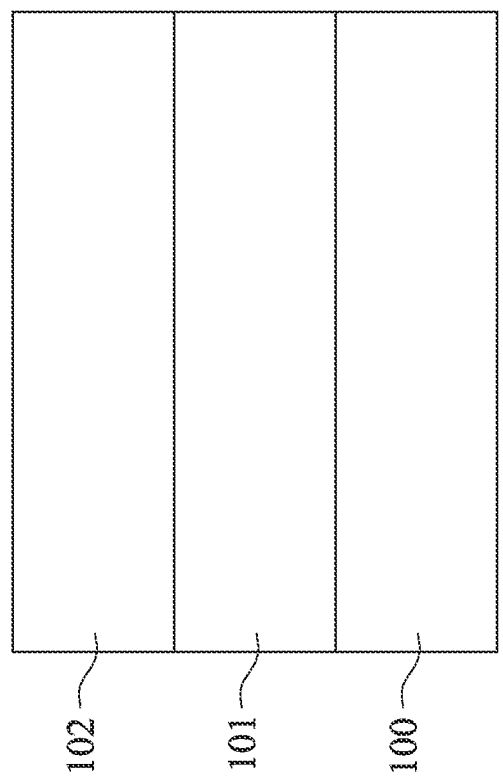

The trenches TR are filled with a dielectric material. A chemical mechanical polish (CMP) is then performed, followed by the removal of the mask layer MK and the pad layer PD. The dielectric material is recessed by an etching step, resulting in recesses 124. The remaining portions of the dielectric material in the trenches TR are hereinafter referred to as shallow trench insulation (STI) regions 103. The resulting structure is shown in FIGS. 3A-3C. The dielectric material may include silicon oxide, and hence is also referred to as oxide in the present disclosure. In some embodiments, other dielectric materials, such as silicon nitride, silicon oxynitride, fluoride-doped silicate glass (FSG), or a low-K dielectric material, may also be used. In an embodiment, the oxide may be formed using a high-density-plasma (HDP) chemical vapor deposition (CVD) process, using silane ($SiH_4$) and oxygen ($O_2$) as reacting precursors. In other embodiments, the oxide may be formed using a sub-atmospheric CVD (SACVD) process or high aspect-ratio process (HARP), wherein process gases may comprise tetraethylorthosilicate (TEOS) and/or ozone ($O_3$). In yet other embodiments, the oxide may be formed using a spin-on-dielectric (SOD) process, such as hydrogen silsesquioxane (HSQ) or methyl silsesquioxane (MSQ).

In one embodiment, the etching step may be performed using a wet etching process, for example, by dipping the substrate 100 in hydrofluoric acid (HF). In another embodiment, the etching step may be performed using a dry etching process, for example, the dry etching process may be performed using $CHF_3$ or $BF_3$ as etching gases. Throughout the description, a portion of the strip 120 higher than a top surface of the STI regions 126 is referred to as a fin (or protruding fin) 102. A portion of the strip lower than the fin 102 is referred to as punch-through stopper 101. It is noted that the reference numerals 101 and 102 are omitted in perspective views throughout the description for clarity.

Figure 4A:
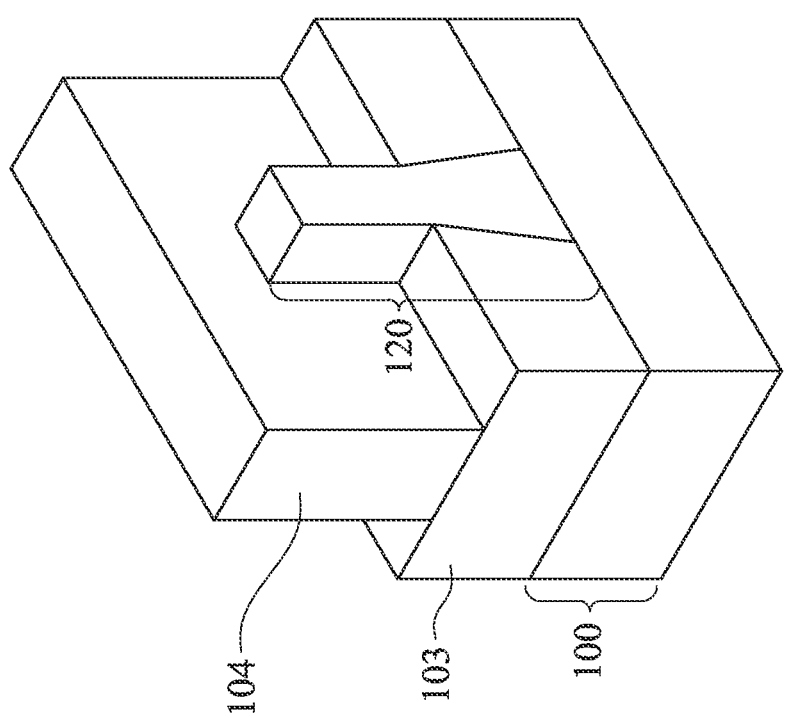
Figure 4C:
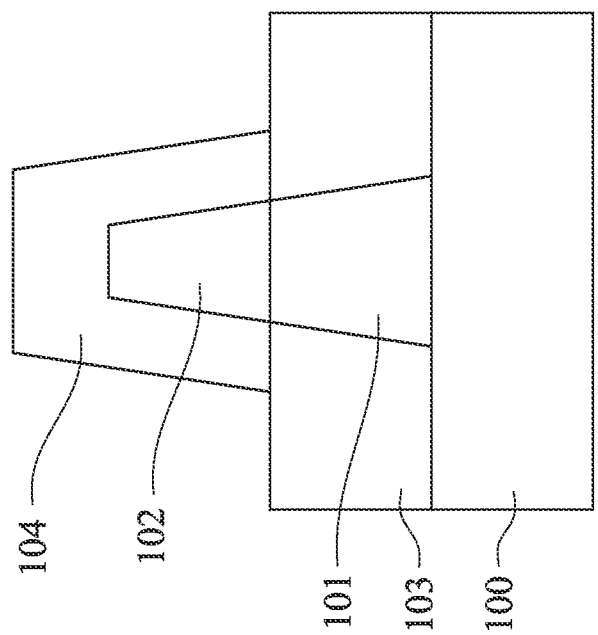
Figure 4B:
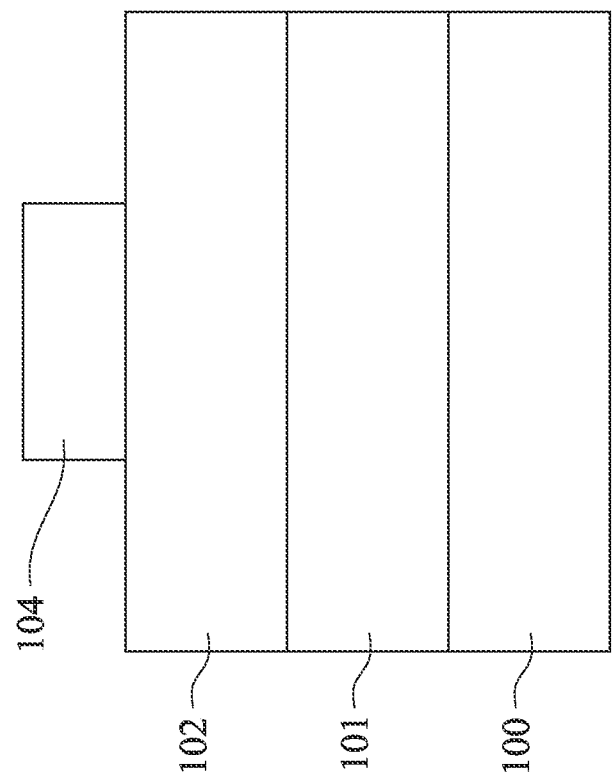

A dummy gate stack 104 is formed across the fin 102 and extends over the STI regions 103, as shown in FIGS. 4A-4C. The dummy gate stack 104 includes sacrificial material and optionally one or more additional layers. The additional layers may include interfacial layers, etch stop layers, and/or dielectric layers. The sacrificial material may be polysilicon. It is noted that the fin 102 has a portion covered by and below the dummy gate stack 104 and is referred to as a channel portion hereafter.

Figure 5B:
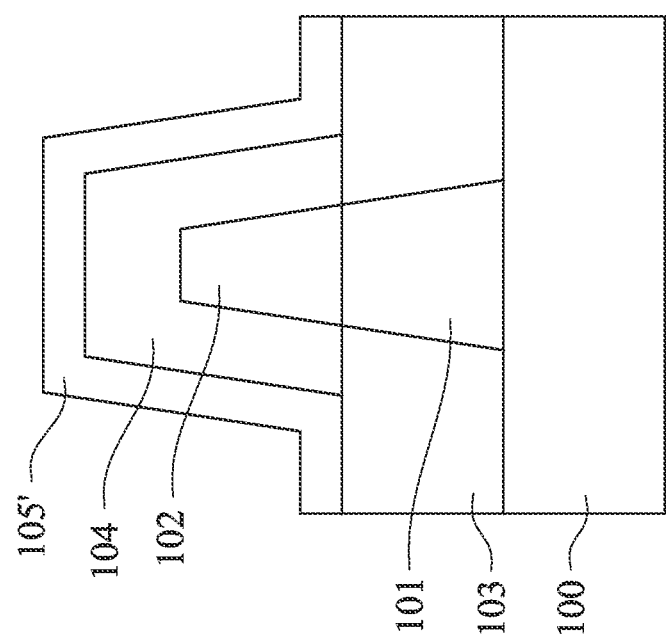
Figure 5A:
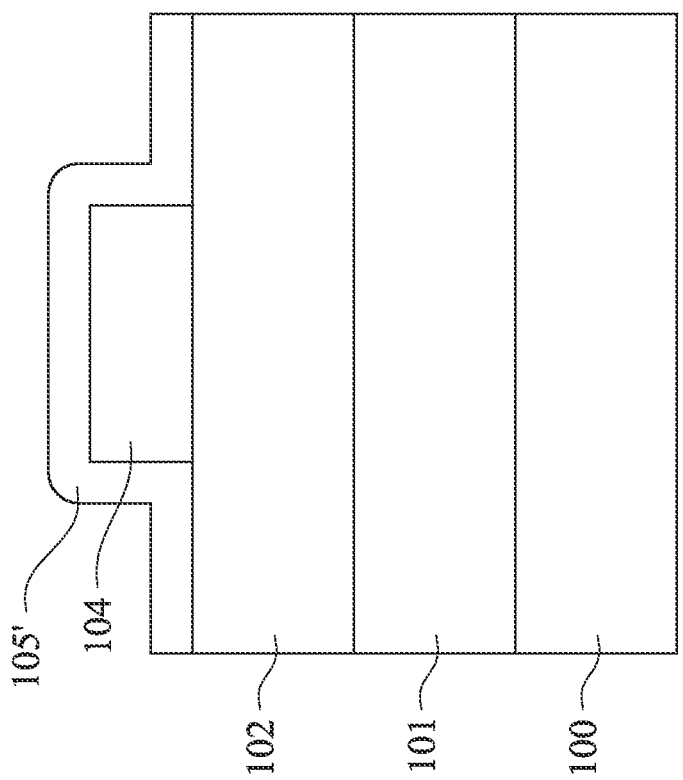

Next, referring to FIGS. 5A-5B, after the dummy gate stack 104 is formed, a spacer layer 105' is formed as a blanket layer to cover the structure shown in FIGS. 4A-4C by conformally depositing, such as by chemical vapor deposition (CVD), atomic layer deposition (ALD), or the like. In some embodiments, the spacer layer 105' is made of one or more layers of silicon nitride, silicon oxide, silicon oxynitride, silicon carbide, or other applicable dielectric materials. The spacer layer 105' is subsequently anisotropically etched to form gate spacers 105 along opposing sidewalls of the dummy gate stack 104.

Figure 6A:
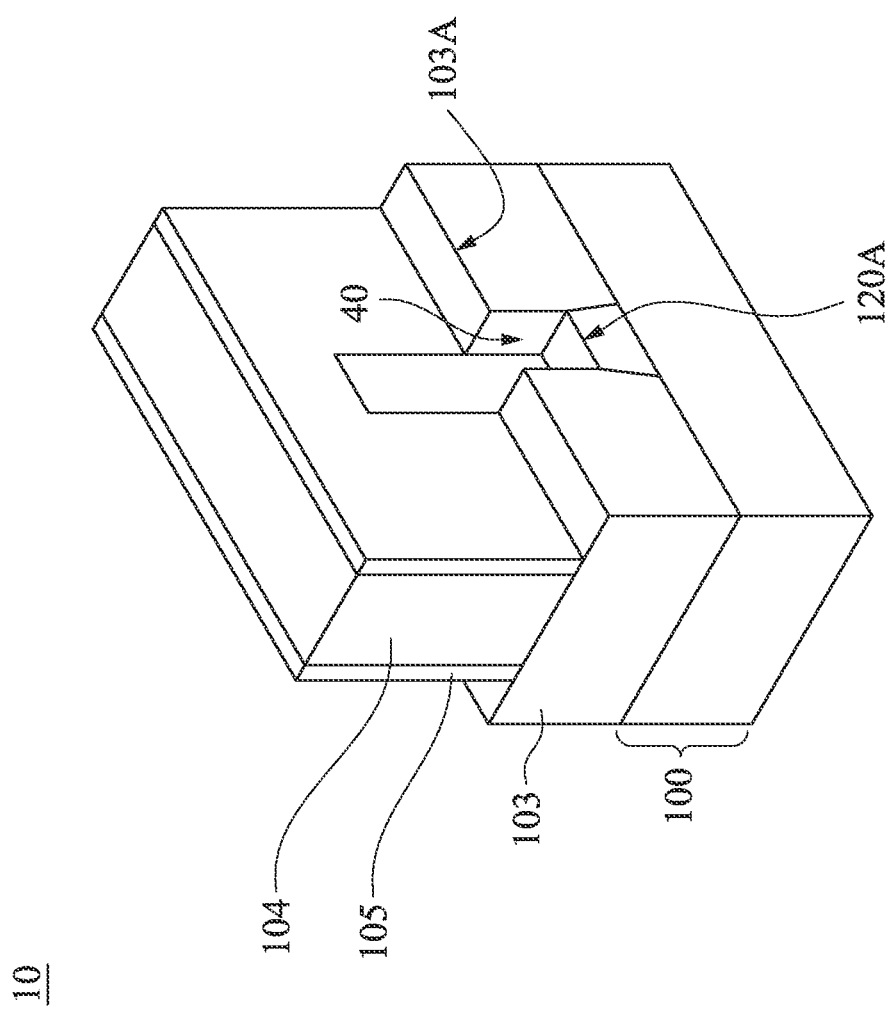
Figure 6C:
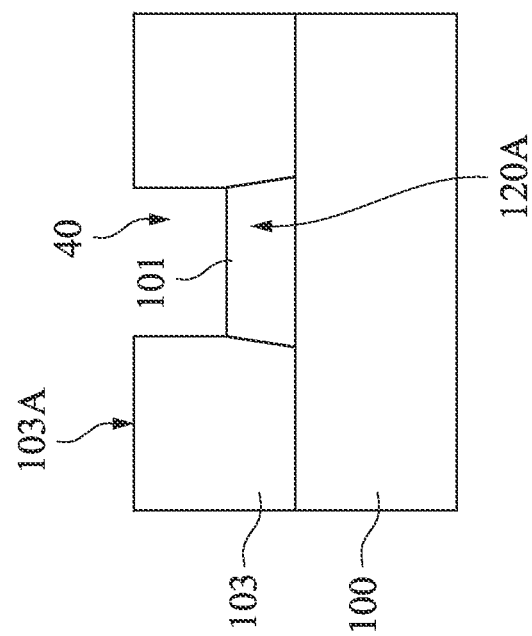
Figure 6B:
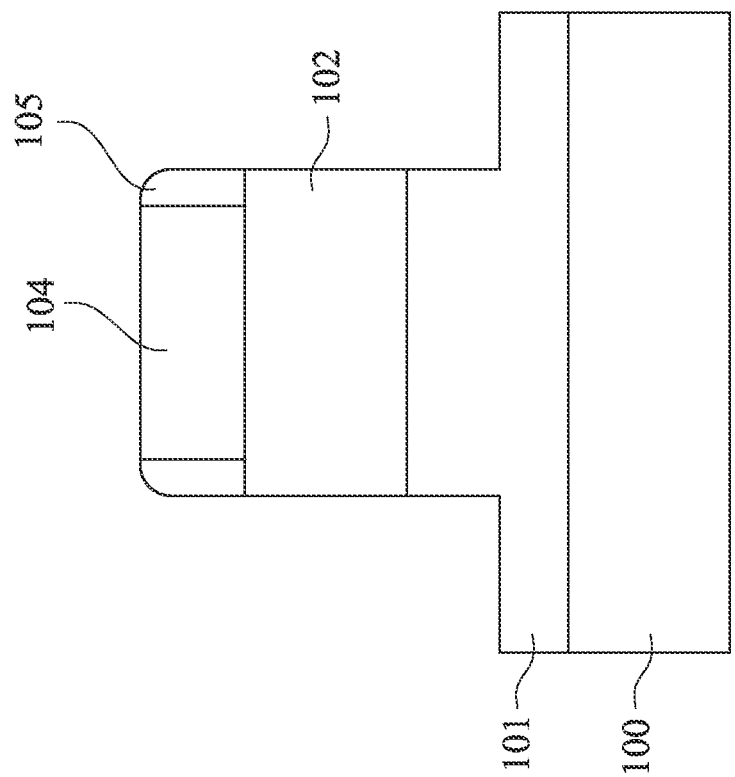

An etching step (referred to as source/drain recessing hereinafter) is then performed to etch the portions of the protruding fins 102 that are not covered by the dummy gate stack 104 and the gate spacers 105, resulting in the structure shown in FIGS. 6A-6C. The recessing may be anisotropic, and hence the portions of protruding fins 102 directly underlying the dummy gate stack 104 and the gate spacers 105 are protected, and are not etched. Top surfaces 120A of the recessed strips 120 may be lower than the top surfaces 103A of the STI regions 103 in accordance with some embodiments. Recesses 40 are accordingly formed between the STI regions 103. The recesses 40 are located on opposite sides of the dummy gate stack 104.

Figure 7A:
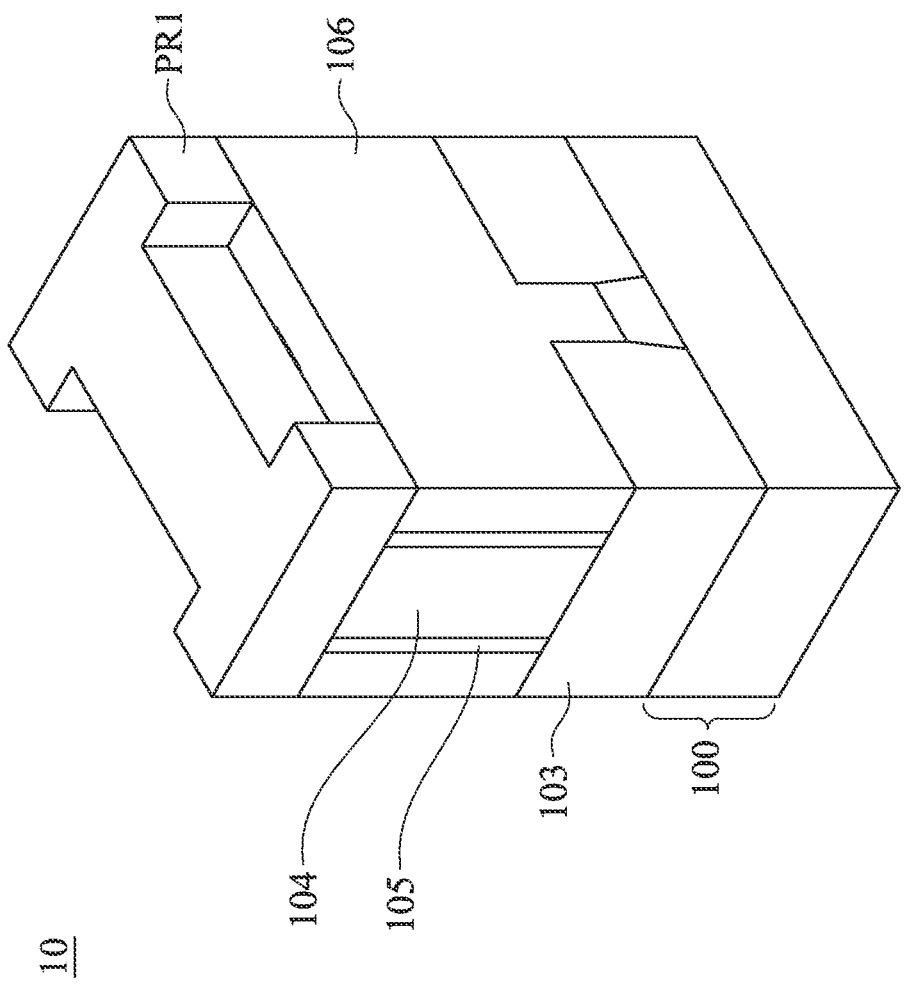
Figure 7C:
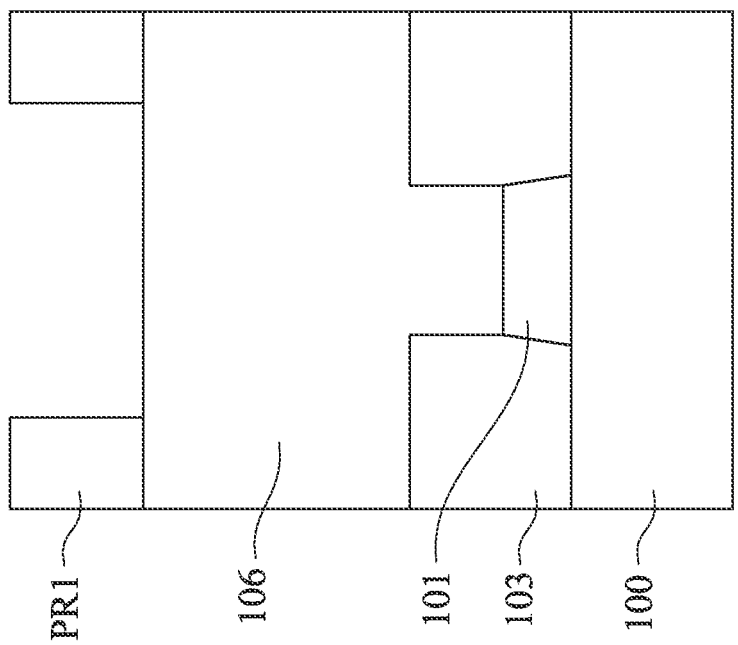
Figure 7B:
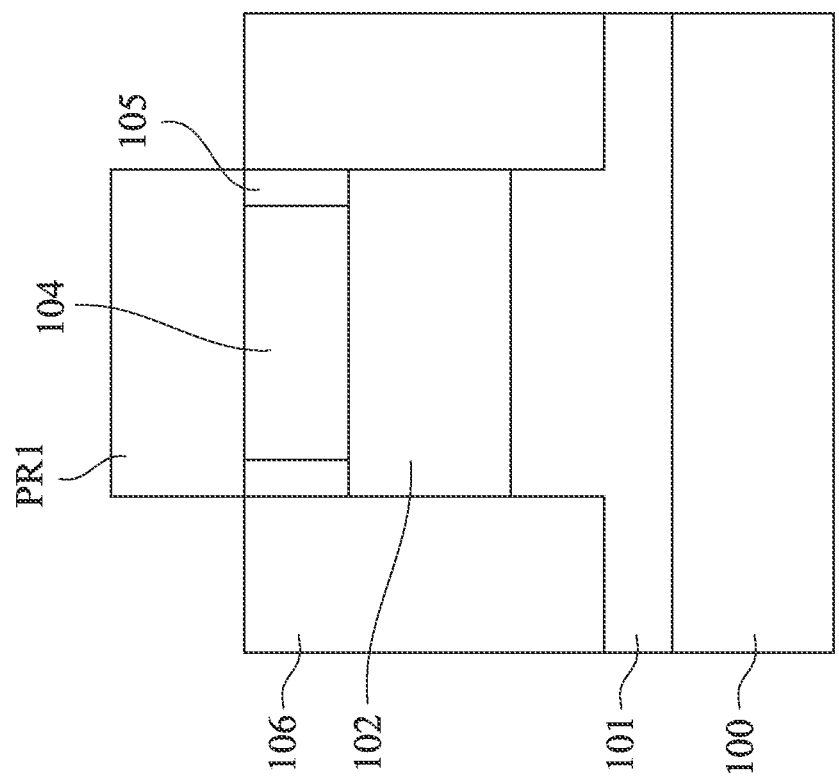

FIGS. 7A-7C illustrate formation of a mask layer 106 and a patterned photoresist PR1. The mask layer 106 is used as a hard mask during subsequent photolithography process. The mask layer 106 is filled into the recesses 40 (see FIGS. 6A-6C). The mask layer 106 may be formed of silicon nitride or the like using, for example, flowable CVD (FCVD), spin-on coating, CVD, or other deposition methods. A planarization step such as chemical mechanical polish (CMP) or mechanical grinding may be performed to level top surfaces of the mask layer 106, the dummy gate stack 104 and the gate spacers 105 with each other. A photo-sensitive layer PR1 is formed on the mask layer 106 and is then patterned, forming openings in the photo-sensitive layer PR1.

Figure 8A:
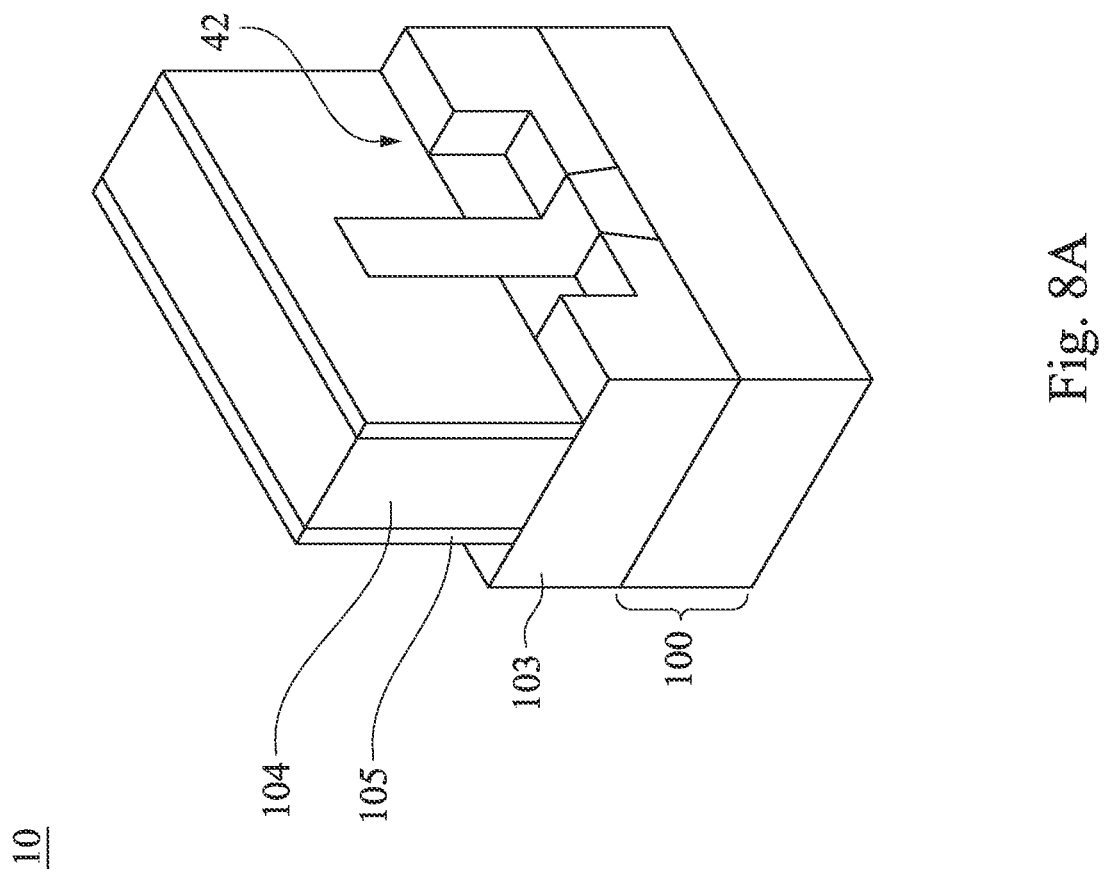
Figure 8C:
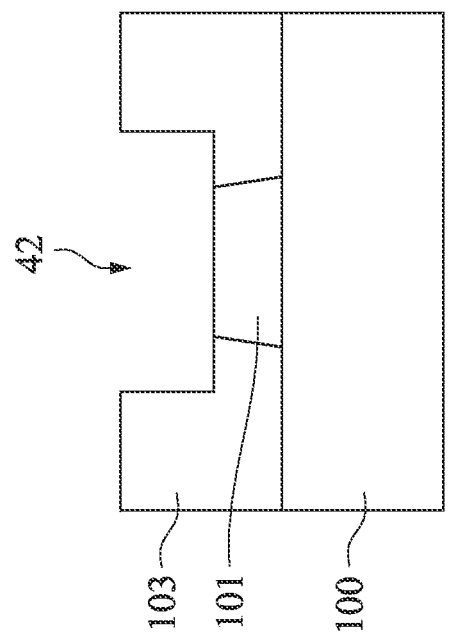
Figure 8B:
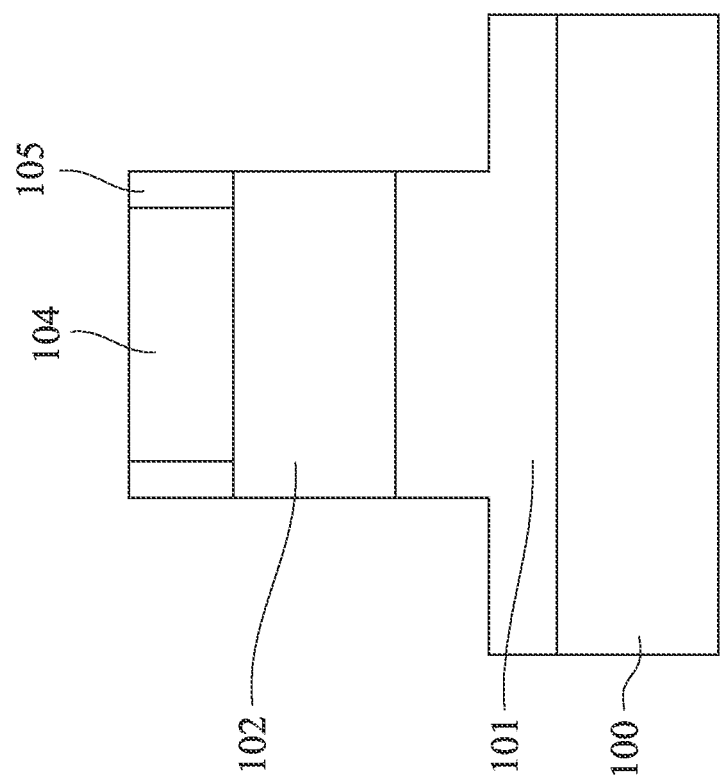

The mask layer 106 is etched through the openings to expose the underlying STI region 103 and the punch-through stopper 101 of the substrate 100. Recesses 42 are accordingly formed in the STI regions 103 and are at opposite sides of the dummy gate stack 104. The photo-sensitive layer PR1 is then removed, such as by an acceptable ashing process, and then the mask layer 106 is removed by an etch process. The resulting structure is shown in FIGS. 8A-8C. The substrate 100 (e.g., punch-through stopper 101) is exposed.

Figure 9A:
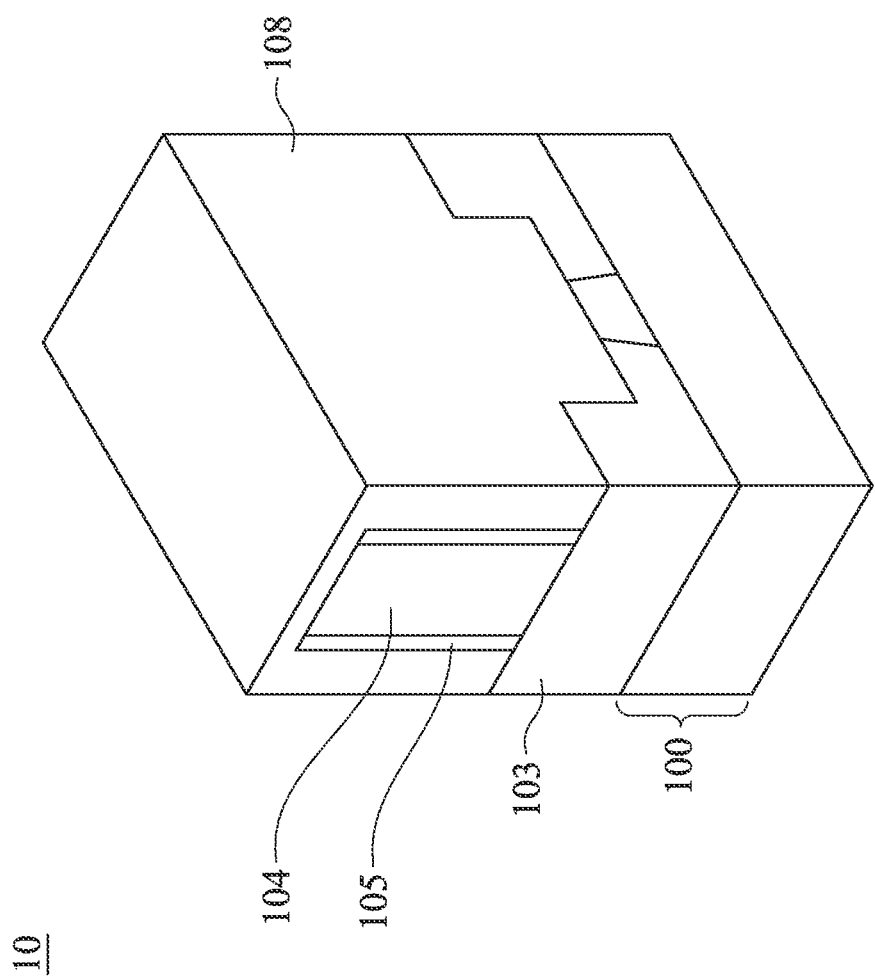
Figure 9C:
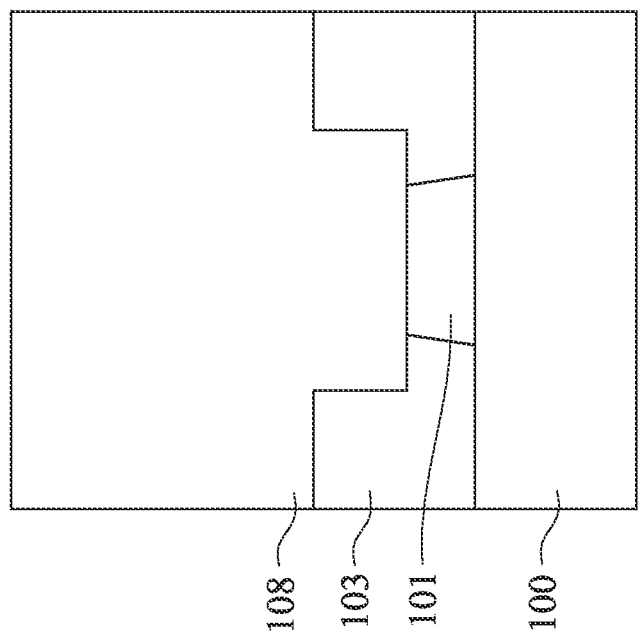
Figure 9B:
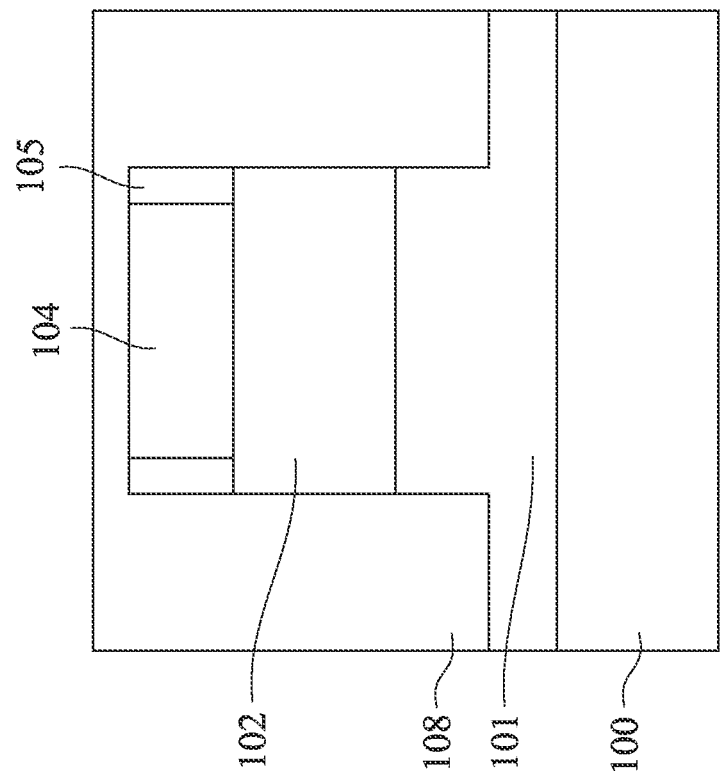

Referring to FIGS. 9A-9C. A thermal conductive layer 108 is formed to cover the structure shown in FIGS. 8A-8C. The thermal conductive layer 108 fills into the recesses 42 (see FIGS. 8A-8C). The thermal conductive layer 108 has a high thermal conductivity, for example, greater than 1.4 W/m·K, which is the thermal conductivity of silicon oxide. If the thermal conductivity of the thermal conductive layer is less than 1.4 W/m·K, heat generated by the source-to-drain current may not be dissipated into the substrate 100 efficiently, leading to unwanted heat flowing toward the channel.

In some embodiments, the thermal conductive layer 108 is a dielectric layer, such as BeO, AlN, or chemical vapor deposited diamond. The thermal conductive layer 108 has an ability to tolerate high temperature. In some embodiments where the thermal conductive layer 108 includes BeO, the thermal conductive layer 108 can tolerate a temperature from 550° C. to 650° C. for 2 to 4 minutes, for example, of about 600° C. for 3 minutes. The thermal conductive layer 108 may be formed using ALD. In the ALD process, alternating cycles are performed. In one cycle, a precursor gas is turned on. In another cycle, an oxidant gas is turned on. These cycles are repeated for a number of times, which can be precisely controlled to grow a desired material with a desired thickness. In one embodiment, the precursor gas includes beryllium chloride ($BeCl_2$), beryllium acetylacetonate (Be(acac), in which "acac" refers to $CH_3COCHCOCH_3$), dimethylberyllium ($Be(CH_3)_2$), or diethylberyllium ($Be(C_2H_5)_2$). In some embodiments, the oxidant gas includes water ($H_2O$), oxygen, or ozone. In this embodiment, the process temperature is in a range from 200° C. to 250° C.

In some embodiments where the thermal conductive layer 108 includes AlN, the thermal conductive layer 108 can tolerate a temperature from 600° C. to 700° C. for to 35 minutes, for example, of about 650° C. for 30 minutes. The thermal conductive layer 108 may be formed using ALD. In the ALD process, alternating cycles are performed. In one cycle, a precursor gas is turned on. In another cycle, a nitridant gas is turned on. These cycles are repeated for a number of times, which can be precisely controlled to grow a desired material with a desired thickness. In one embodiment, the precursor gas includes $AlCl_3$, Trimethylaluminium (TMA) or triethylaluminum (TEA). In some embodiments, the nitridant gas includes $NH_3/Ar/H_2$ gas mixture, $N_2H_2$, or $N_2H_4$. In this embodiment, the process temperature is in a range from 300° C. to 400° C., such as about 350° C.

Figure 10A:
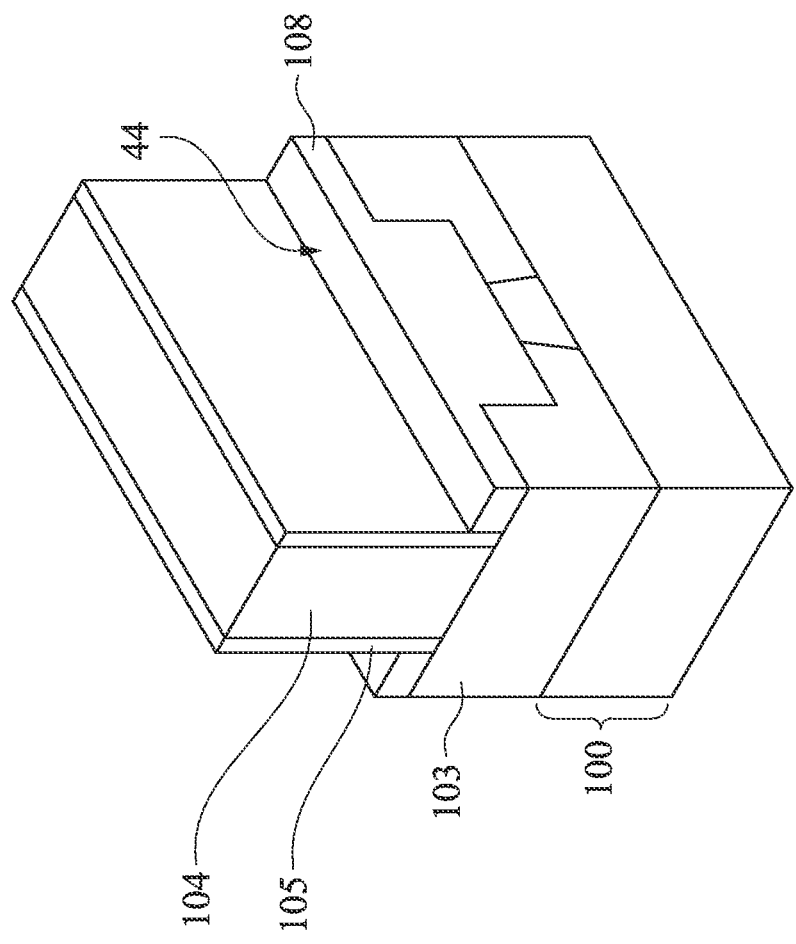
Figure 10C:
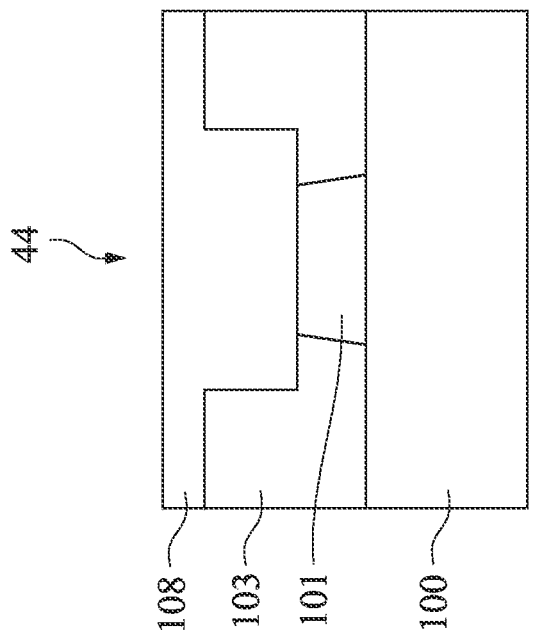
Figure 10B:
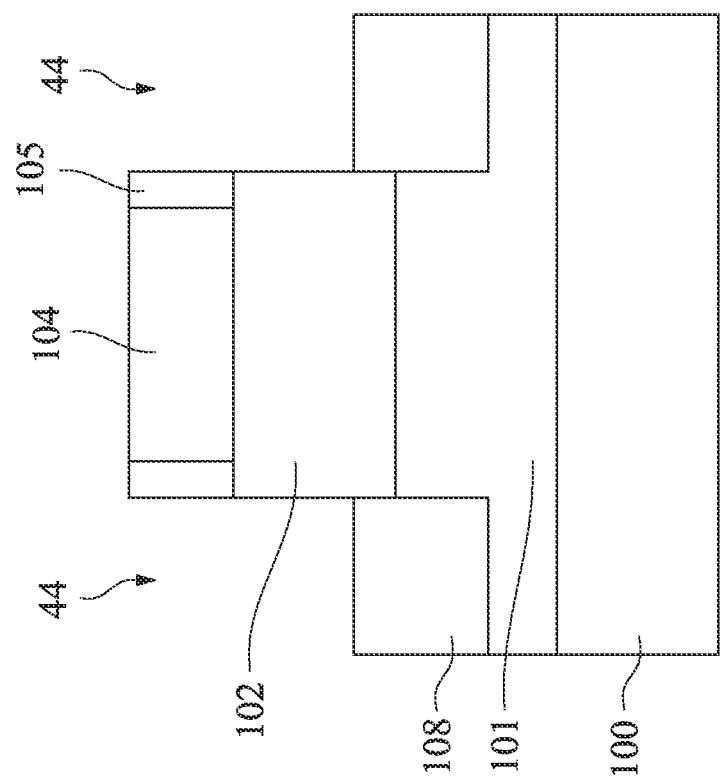

In FIGS. 10A-10C, the thermal conductive layer 108 is recessed in an etching step(s), so that recesses 44 are formed. The etching step(s) may include an anisotropic dry etch. For example, the etching step(s) may include a dry etch process using reaction gas(es) that selectively etch the thermal conductive layer 108 without etching the dummy gate stack 104 and the gate spacers 105. The channel of the fin 102 is exposed by the thermal conductive layer 108.

Figure 11A:
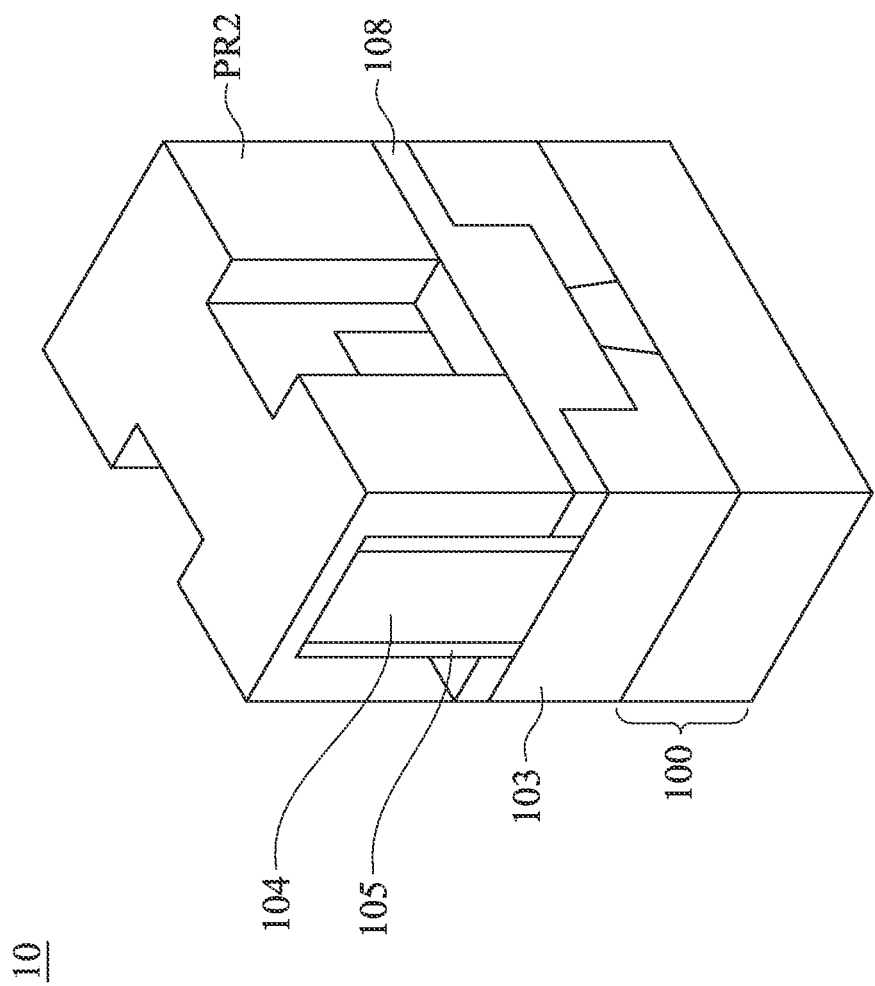
Figure 11C:
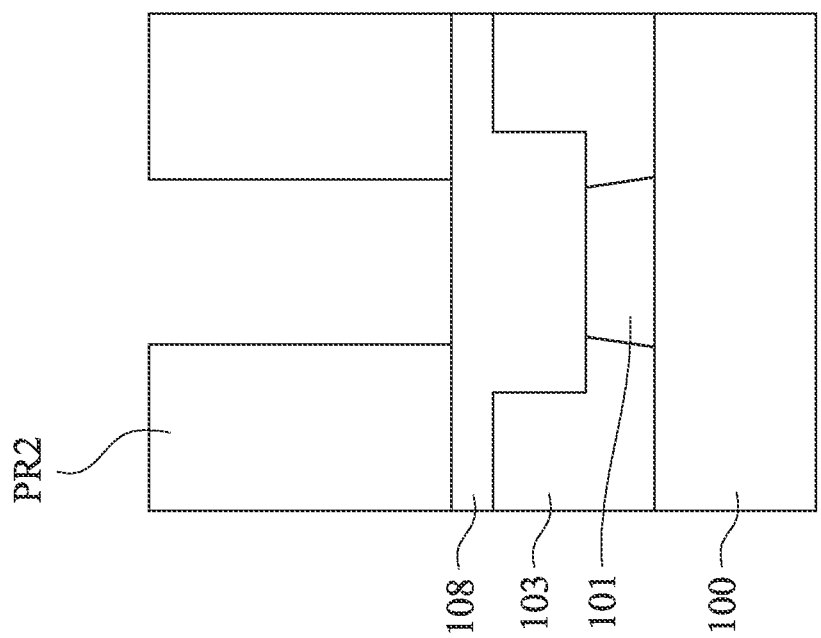
Figure 11B:
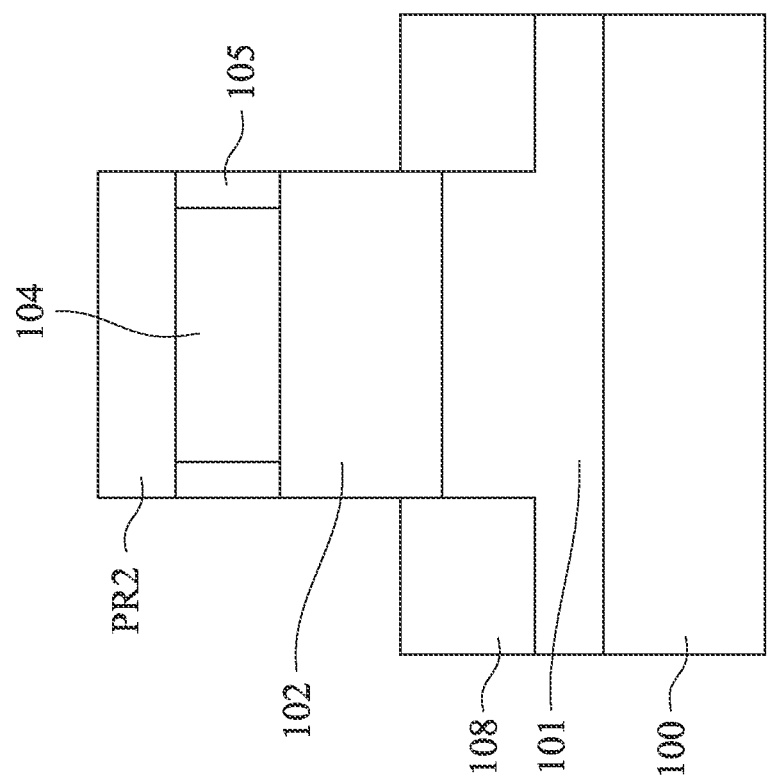

A photo-sensitive layer PR2 is formed on the thermal conductive layer 108 and is then patterned, forming openings in the photo-sensitive layer PR2, as shown in FIGS. 11A-11C.

Figure 12A:
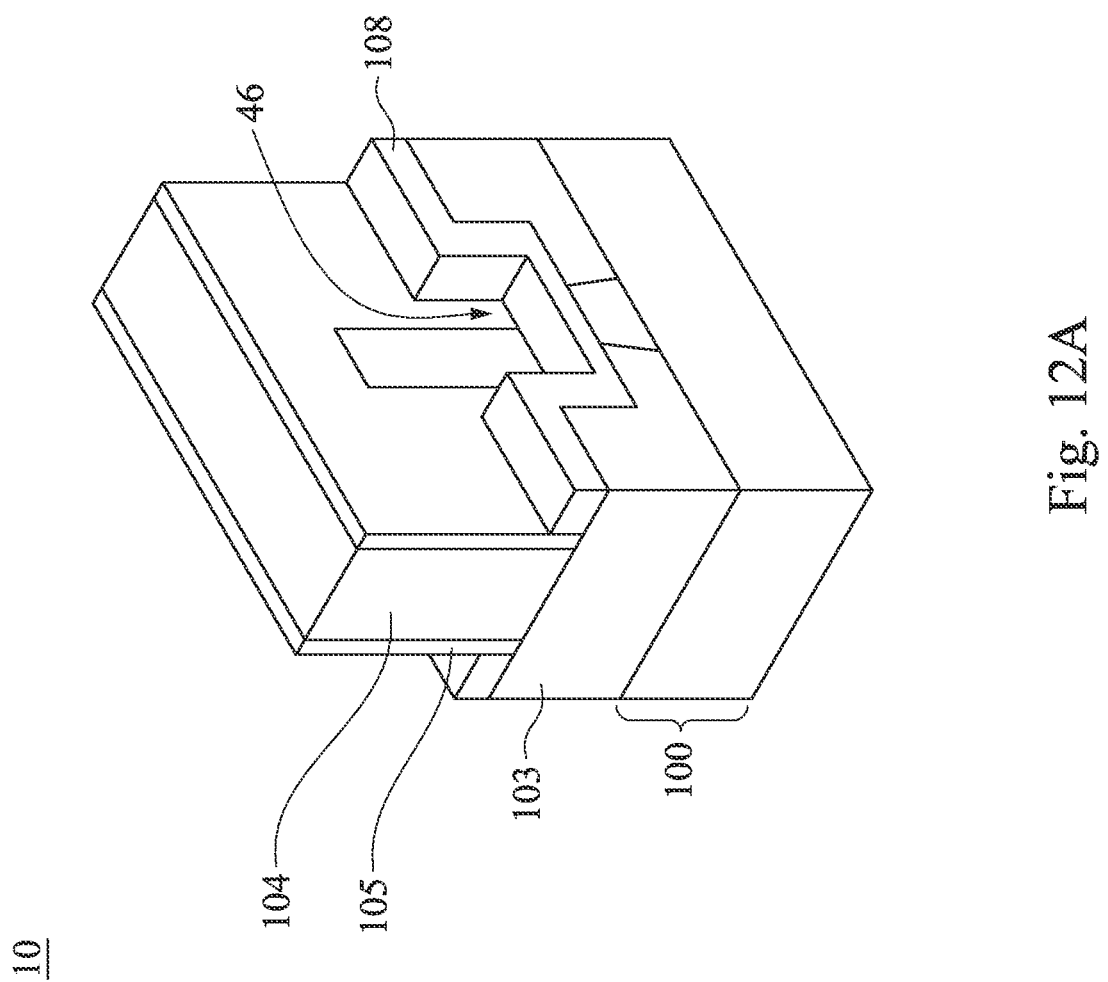
Figure 12C:
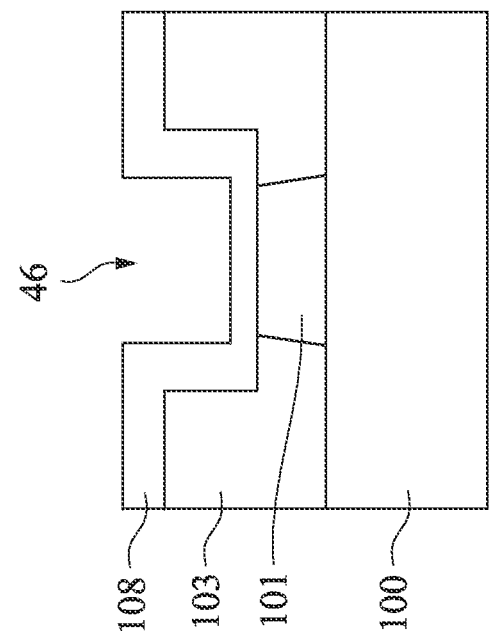
Figure 12B:
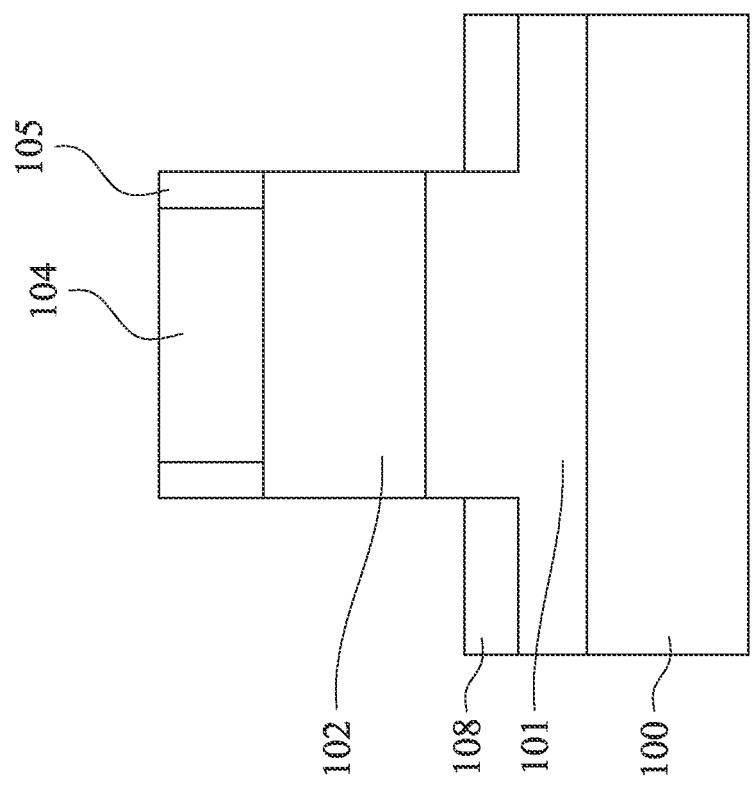

Next, the thermal conductive layer 108 is patterned using a lithography process. For example, in FIGS. 12A-12C, the thermal conductive layer 108 is etched through the openings. A recess 46 is formed in the thermal conductive layer 108. The photo-sensitive layer PR2 is then removed, such as by an acceptable ashing process. The thermal conductive layer 108 has a U-shaped profile when viewed in cross-section A-A'. The thermal conductive layer 108 still covers the punch-through stopper 101 of the substrate 100 after the lithography process in one example.

Figure 12D:
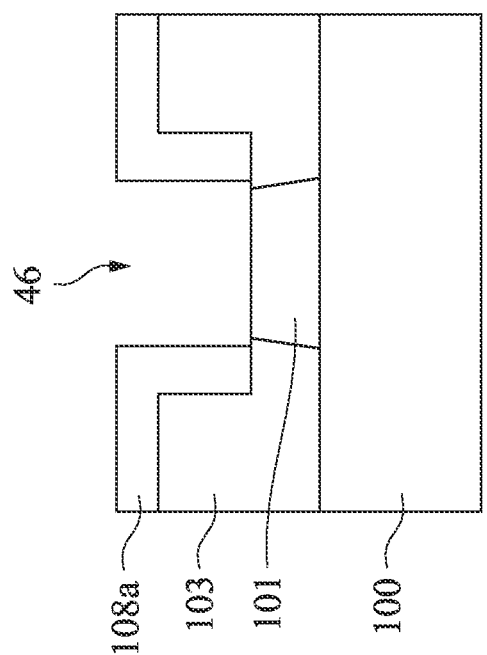
Figure 12E:
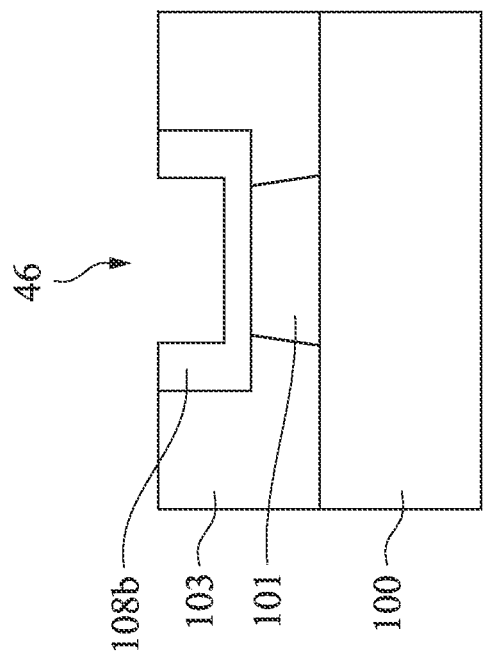

In some other embodiments, a portion of the thermal conductive layer 108a that covers the punch-through stopper 101 of the substrate 100 is removed, as shown in FIG. 12D. The punch-through stopper 101 is exposed by the thermal conductive layer 108a. In some other embodiments, portions of the thermal conductive layer 108b over the STI regions 103 are removed by the lithography process, so that the STI regions 103 are exposed, as shown in FIG. 12E.

Figure 13A:
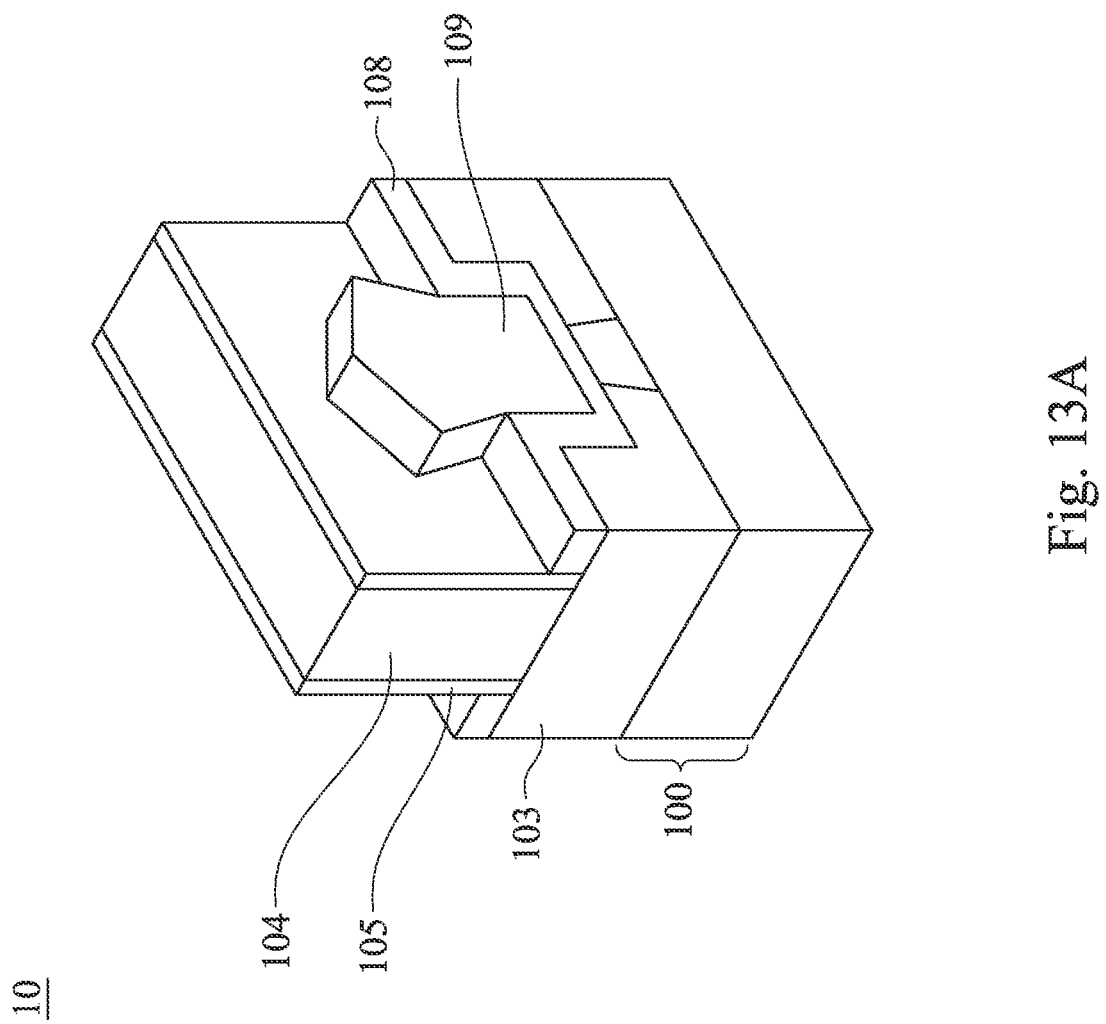
Figure 13C:
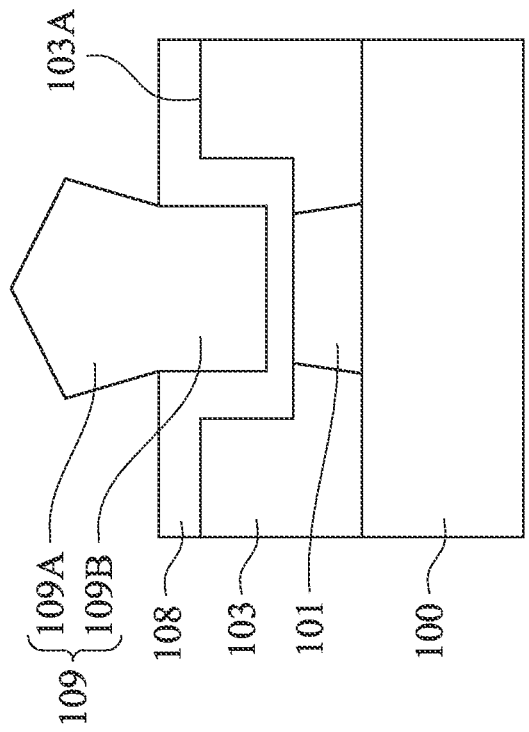
Figure 13B:
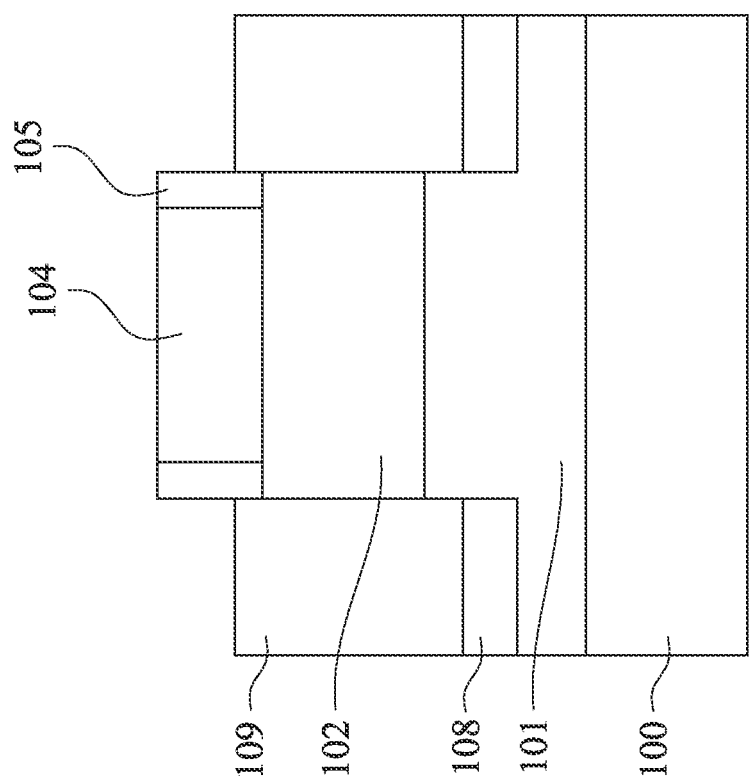

Epitaxial regions (source/drain regions) 109 are formed by selectively growing a semiconductor material in the recesses 46, resulting in the structure in FIGS. 13A-13C. In accordance with some exemplary embodiments, the epitaxy regions 109 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, the epitaxy regions 109 is formed of a III-V compound semiconductor such as GaAs, InP, GaN, InGaAs, InAlAs, GaSb, AlSb, AlAs, AlP, GaP, combinations thereof, or multi-layers thereof. After epitaxy regions 109 fully fill recesses 46, epitaxy regions 109 start expanding horizontally, and facets may be formed.

After the epitaxy step, the epitaxy regions 109 may be further implanted with a p-type or an n-type impurity to form source and drain regions, which are also denoted using reference numeral 109. In accordance with alternative embodiments of the present disclosure, the implantation step is skipped when the epitaxy regions 109 are in-situ doped with the p-type or n-type impurity during the epitaxy. The epitaxy regions 109 include lower portions 109B that are formed in the STI regions 103, and upper portions 109A that are formed over the top surfaces 103A of the STI regions 103.

Figure 14A:
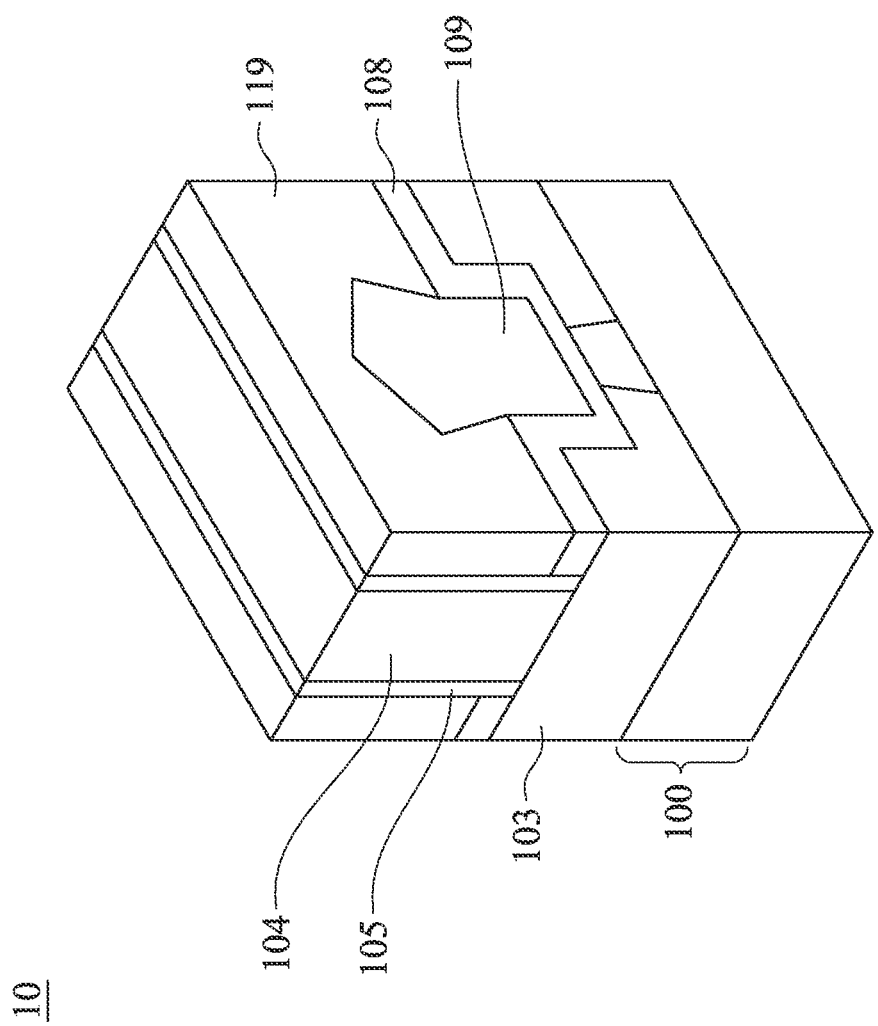
Figure 14C:
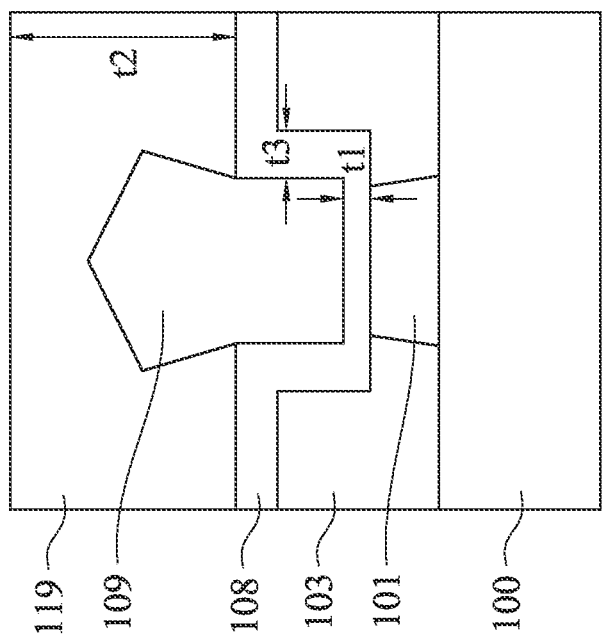
Figure 14B:
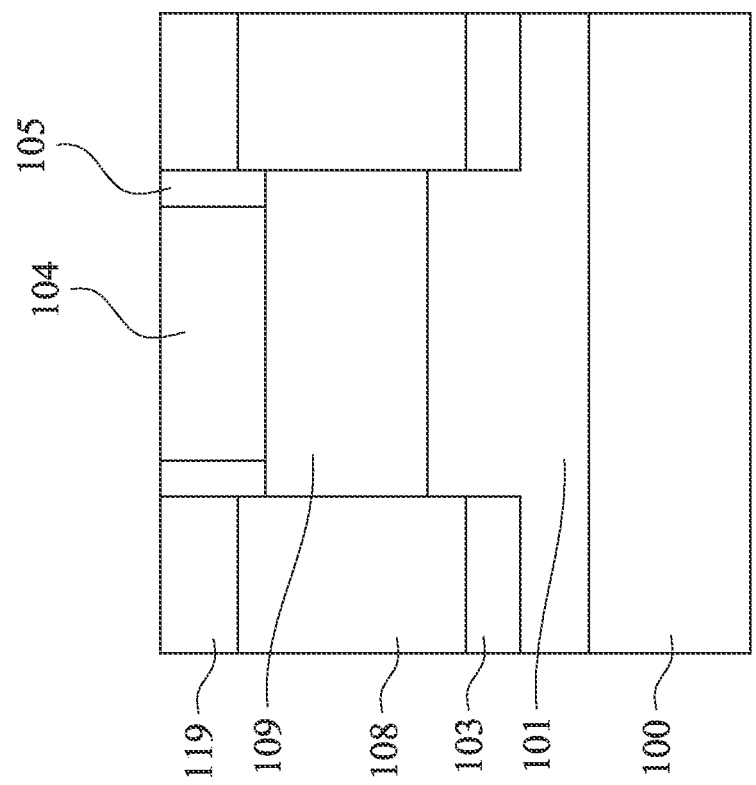

In FIGS. 14A-14C, a thermal conductive layer 119 is formed on the structure in FIGS. 13A-13C. A planarization step such as chemical vapor deposition (CMP) or mechanical grinding may be performed to level top surfaces of the thermal conductive layer 119, the gate spacers 105 and the dummy gate stack 104. The thermal conductive layer 119 has a similar material and formation method to the material and formation method of the thermal conductive layer 108, so that the description thereof is not repeated herein.

Because the thermal conductive layers 108, 119 have a high thermal conductivity, the heat generated by the source-to-drain current and/or the anneal process of forming the epitaxy regions 109 can be dissipated into the substrate 100 via the thermal conductive layers 108, 119 efficiently. As a result, the performance and reliability of the semiconductor device 10 can be ensured.

The thermal conductive layer 119 surrounds the upper portion 109A of the epitaxy region 109. In this example, the thermal conductive layer 108 and the thermal conductive layer 119 collectively surround the epitaxy regions 109. As a result, the thermal conductive layers 108, 119 can enhance heat dissipation into the substrate 100.

In some embodiments, the thermal conductive layer 108 has a thickness t1 in a vertical direction from a bottom surface of the thermal conductive layer 108 to a bottom surface of the epitaxy regions 109.

Figure 14E:
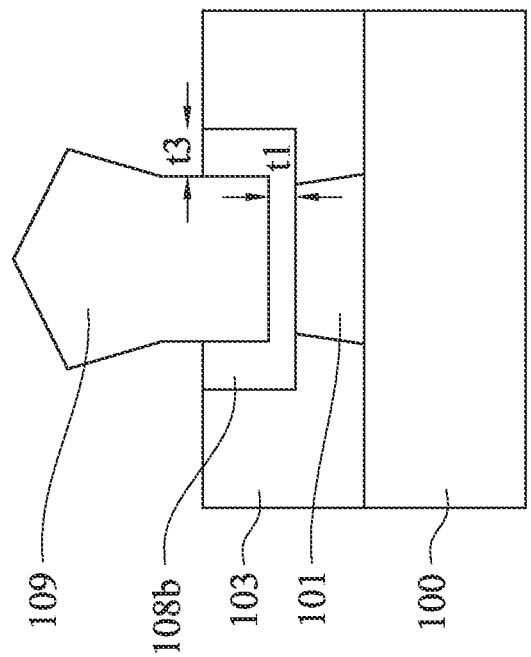
Figure 14D:
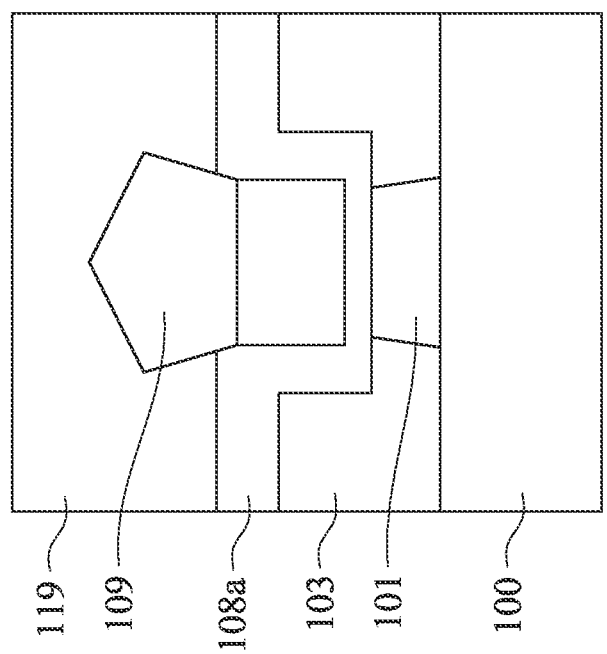

In some embodiment, the thickness t1 is from 0 to 200 nm. In an example, the epitaxy regions 109 and the thermal conductive layer 119 are formed on the structure in FIG. 12D, in which the resulting structure is shown in FIG. 14D. In FIG. 14D, the thickness t1 equals 0 nm. The epitaxy regions 109 are in contact with the substrate 100 (e.g., the punch-through stopper 101). Referring back to FIG. 14C, the thermal conductive layers 108, 119 collectively have a thickness t2 in a vertical direction from a top surface of the STI regions 103 to the top surface of the thermal conductive layer 119. The thickness t2 is in a range from 0 nm to 200 nm. In an example, the epitaxy regions 109 are formed on the structure in FIG. 12E, in which the resulting structure is shown in FIG. 14E. In FIG. 14E, the thickness t2 equals 0 nm. That is, no thermal conductive layer is formed after the formation of the epitaxy regions 109. The STI region 103 and the thermal conductive layer 108b are substantially coplanar. Referring back to FIG. 14C, in some embodiments, the thermal conductive layer 108 has a lateral thickness t3, which extends in a direction parallel to the dummy gate stack 104, from 1 nm to 200 nm.

Figure 15A:
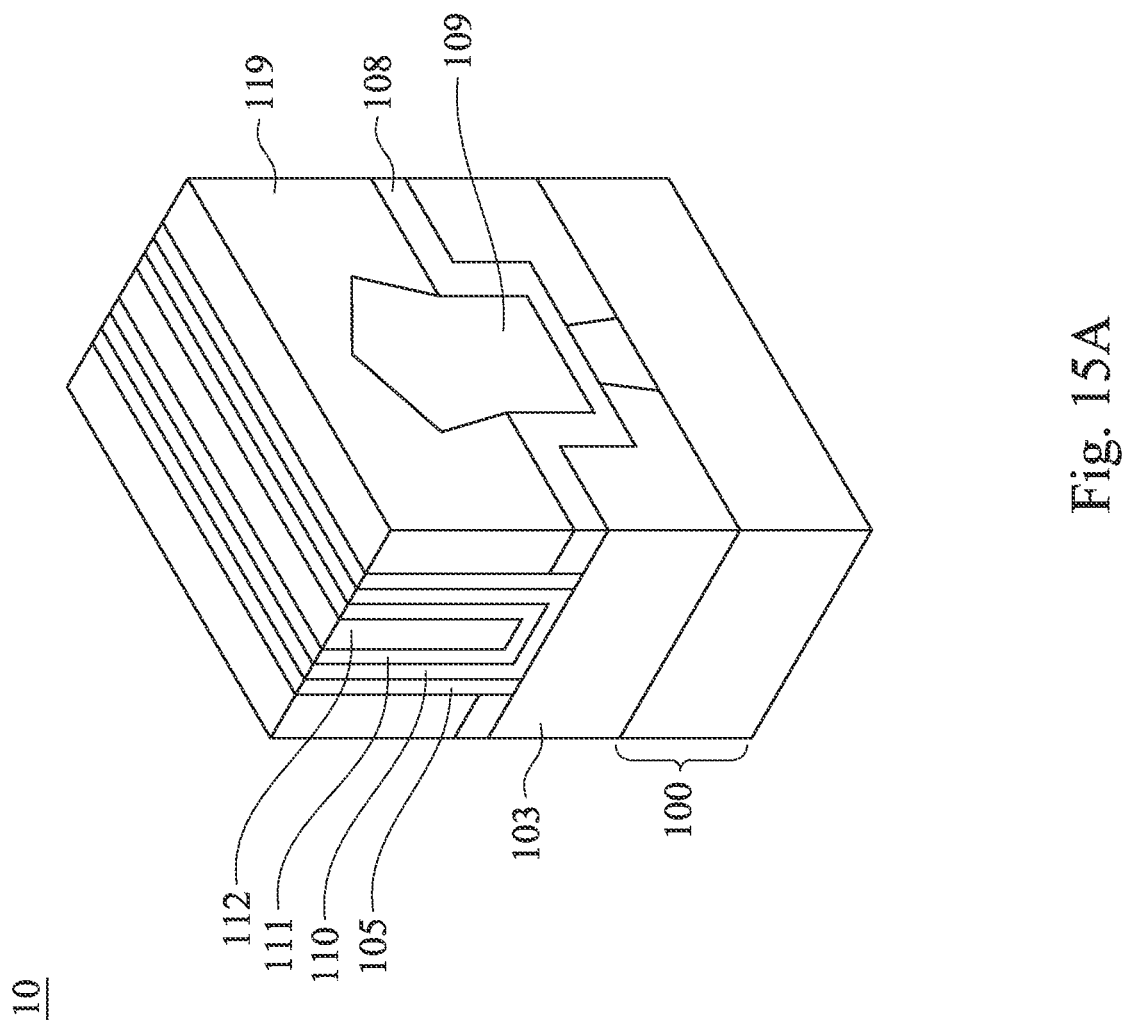
Figure 15C:
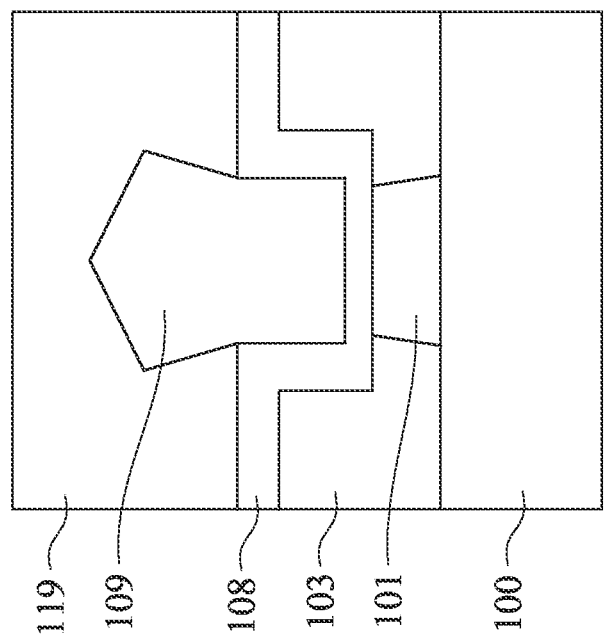
Figure 15B:
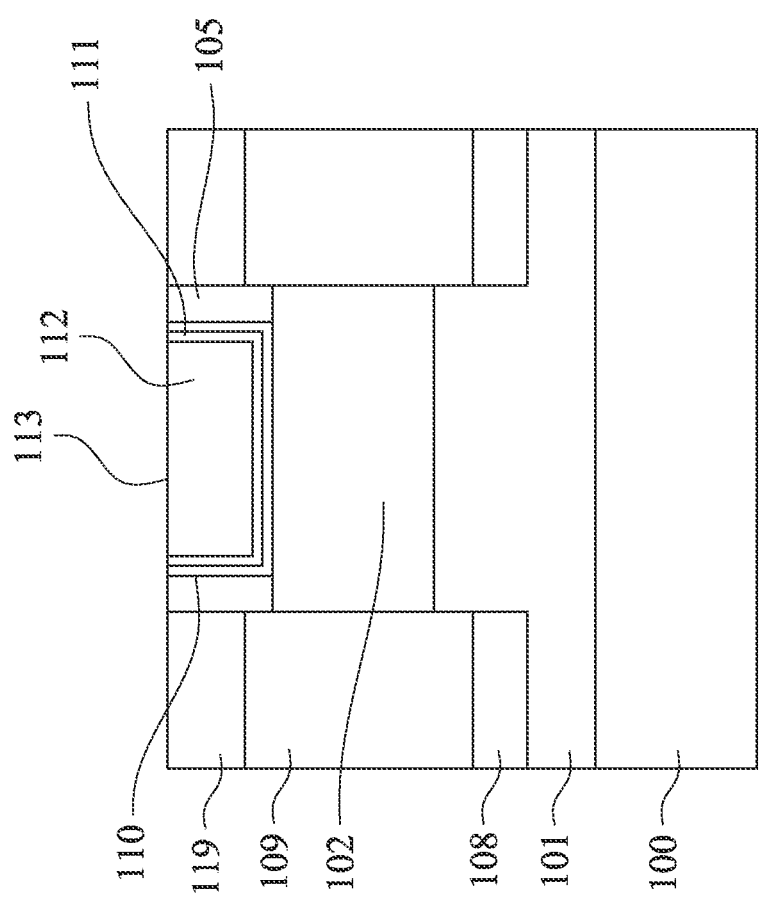

Next, the dummy gate stack 104 is replaced with a replacement gate stack layers which include an interfacial layer (IL) 110, a high-k gate dielectric layer 111 and a metal gate 112. The metal gate 112 is formed by depositing the IL 110, the high-k gate dielectric layer 111 and the metal gate 112 followed by a planarization step such as CMP or mechanical grinding, so that the portions of IL 110, the high-k gate dielectric layer 111, and the metal gate 112 over the thermal conductive layer 119 are removed. As a result, the replacement gate stack 113 is formed. As shown in FIGS. 15A-15C, top surfaces of the replacement gate stack 113, the gate spacers 105, and the thermal conductive layer 119 may be substantially coplanar at this time. The thermal conductive layer 119 laterally surrounds the replacement gate stack 113.

The IL 110 is extends into the trenches. The IL 110 extends on the top surface of the fin 102 and along sidewalls of the gate spacers 105. In accordance with some embodiments, the IL 110 includes an oxide layer such as a silicon oxide layer, which is formed through chemical vapor oxidation process, or a deposition process. The high-k gate dielectric layer 111 is formed overlying the IL 110 and includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. The high-k gate dielectric layer 111 is in contact with the IL 110 and is formed as a conformal layer. In accordance with some embodiments, the high-k gate dielectric layer 111 is formed using ALD or CVD. In an example, the metal gate 112 may include tungsten. In some other embodiments, the metal gate 112 includes stacked layers including a diffusion barrier layer, one (or more) work-function layer over the diffusion barrier layer, and a fill metal layer over the work-function layer. The diffusion barrier layer may be formed of titanium nitride (TiN), which may (or may not) be doped with silicon. The work-function layer determines the work function of the metal gate 112, and includes at least one layer, or a plurality of layers formed of different materials. The specific material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), another barrier layer, which may be another TiN layer, is formed. The fill metal layer may be formed of cobalt (Co), or tungsten (W), for example.

Figure 16B:
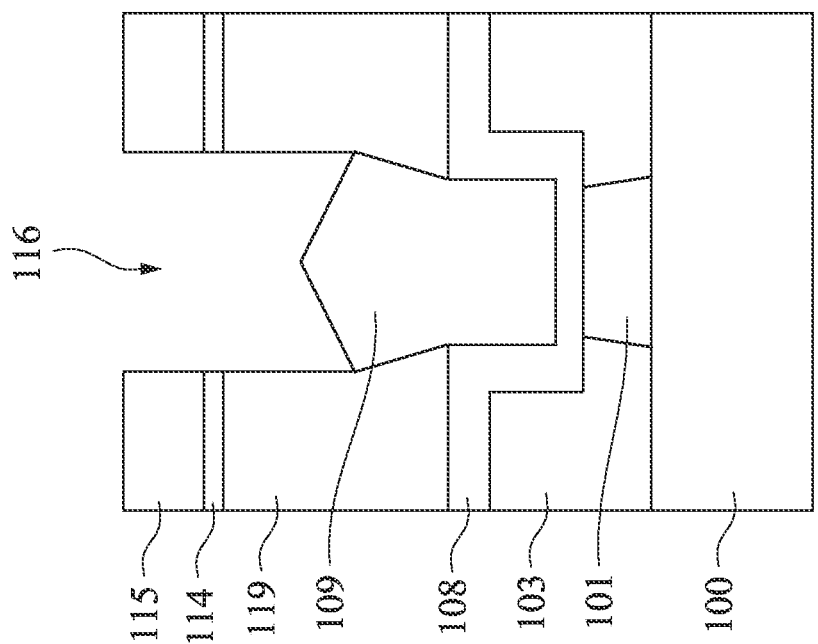
FIGS. 16B and 17B are cross-sectional views at intermediate fabrication stages, illustrating reference cross-section B-B' illustrated in FIG. 1 that is perpendicular to cross-section A-A' and extends through epitaxial source/drain regions of the semiconductor device.
Figure 16A:
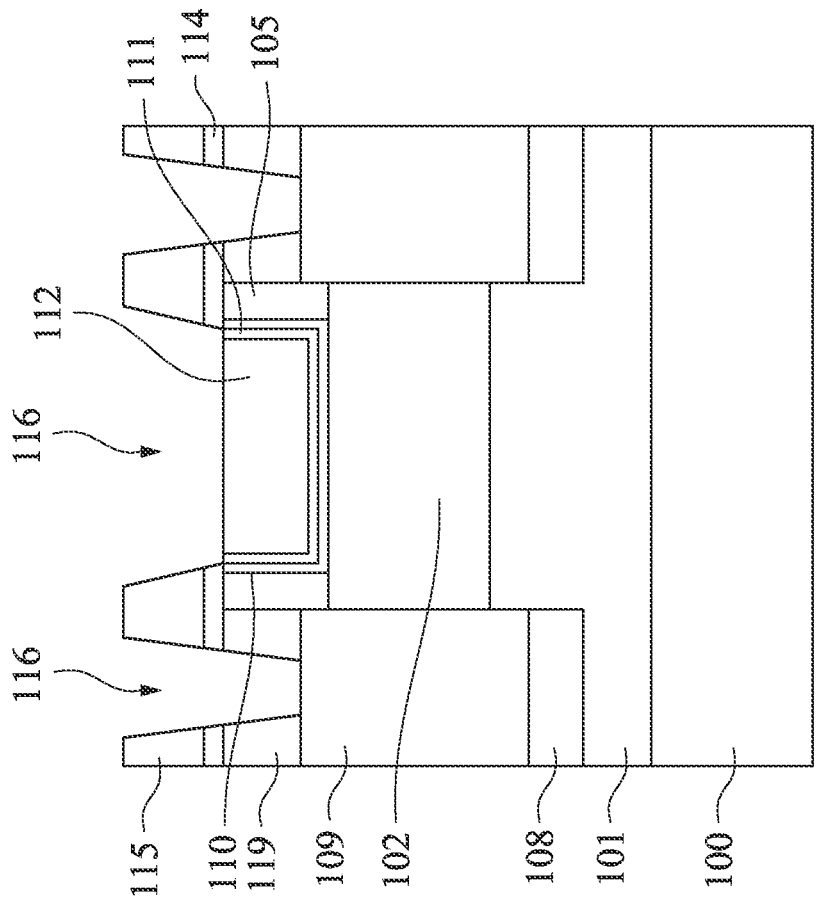
FIGS. 16A and 17A are cross-sectional views at intermediate fabrication stages, illustrating reference cross-section A-A' illustrated in FIG. 1 that extends through a fin along a longitudinal axis of the fin.

FIGS. 16A-17B illustrate the formation of source/drain contact plugs and gate contact plug. Referring to FIGS. 16A-16B, an etch stop layer 114 is formed, followed by the formation of an interlayer dielectric layer (ILD) 115. Throughout the description, the ILD layer 115 is alternately referred to as ILD1. The etch stop layer 114 may be formed of silicon carbide, silicon oxynitride, silicon carbo-nitride, combinations thereof, or composite layers thereof. The etch stop layer 114 may be formed using a deposition method such as CVD, Plasma Enhanced Chemical Vapor Deposition (PECVD), ALD, or the like. The ILD layer 115 may include a material selected from PSG, BSG, BPSG, Fluorine-doped Silicon Glass (FSG), TEOS, or other non-porous low-k dielectric materials. The ILD layer 115 may be formed using spin coating, FCVD, or the like, or formed using a deposition method such as CVD, PECVD, Low Pressure Chemical Vapor Deposition (LPCVD), or the like. Openings 116 are formed through the ILD layer 115, the etch stop layer 114 and the thermal conductive layer 119, such that the source/drain regions and the replacement gate stack are exposed to the openings.

Figure 17B:
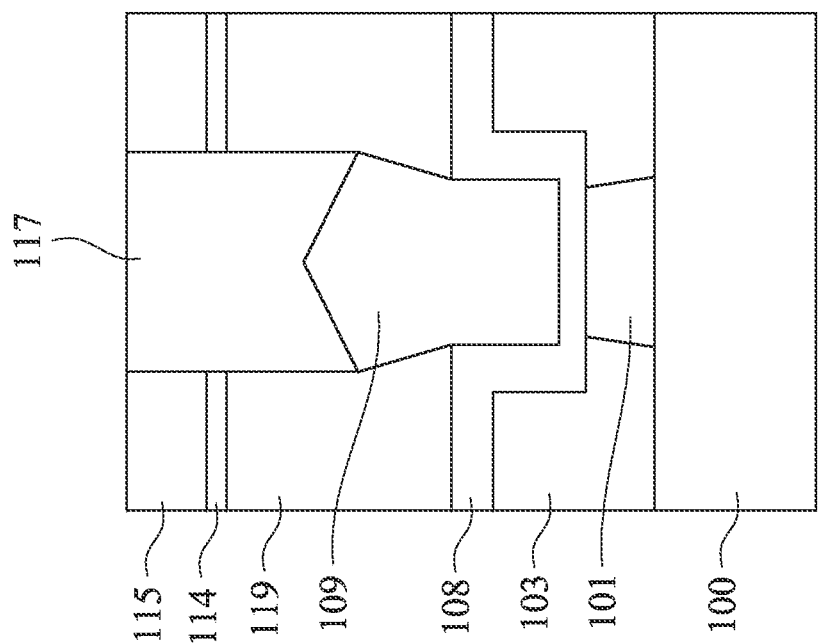
Figure 17A:
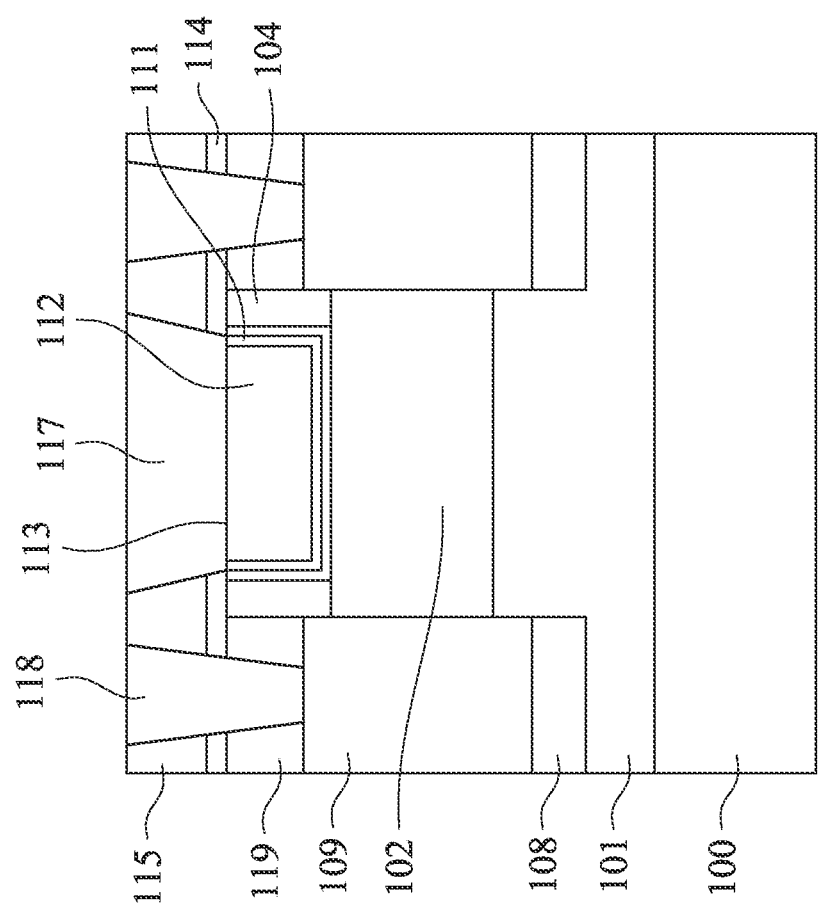

Referring to FIGS. 17A-17B, a contact metal layer is deposited in the openings 116 to form a gate contact 117 and source/drain contacts 118 extending down to the replacement gate stack 113 and the epitaxy regions 109, respectively. The contact metal layer may include copper (Cu), aluminum (Al), tungsten (W), copper or copper alloy, such as copper magnesium (CuMn), copper aluminum (CuAl) or copper silicon (CuSi), or other suitable conductive material. The contact metal layer may be deposited by physical vapor deposition (PVD), CVD, metal-organic chemical vapor deposition (MOCVD), or plating. Additionally, a CMP is performed to etch back the excessive contact metal layer to provide a substantially planar surface.

Figure 18:
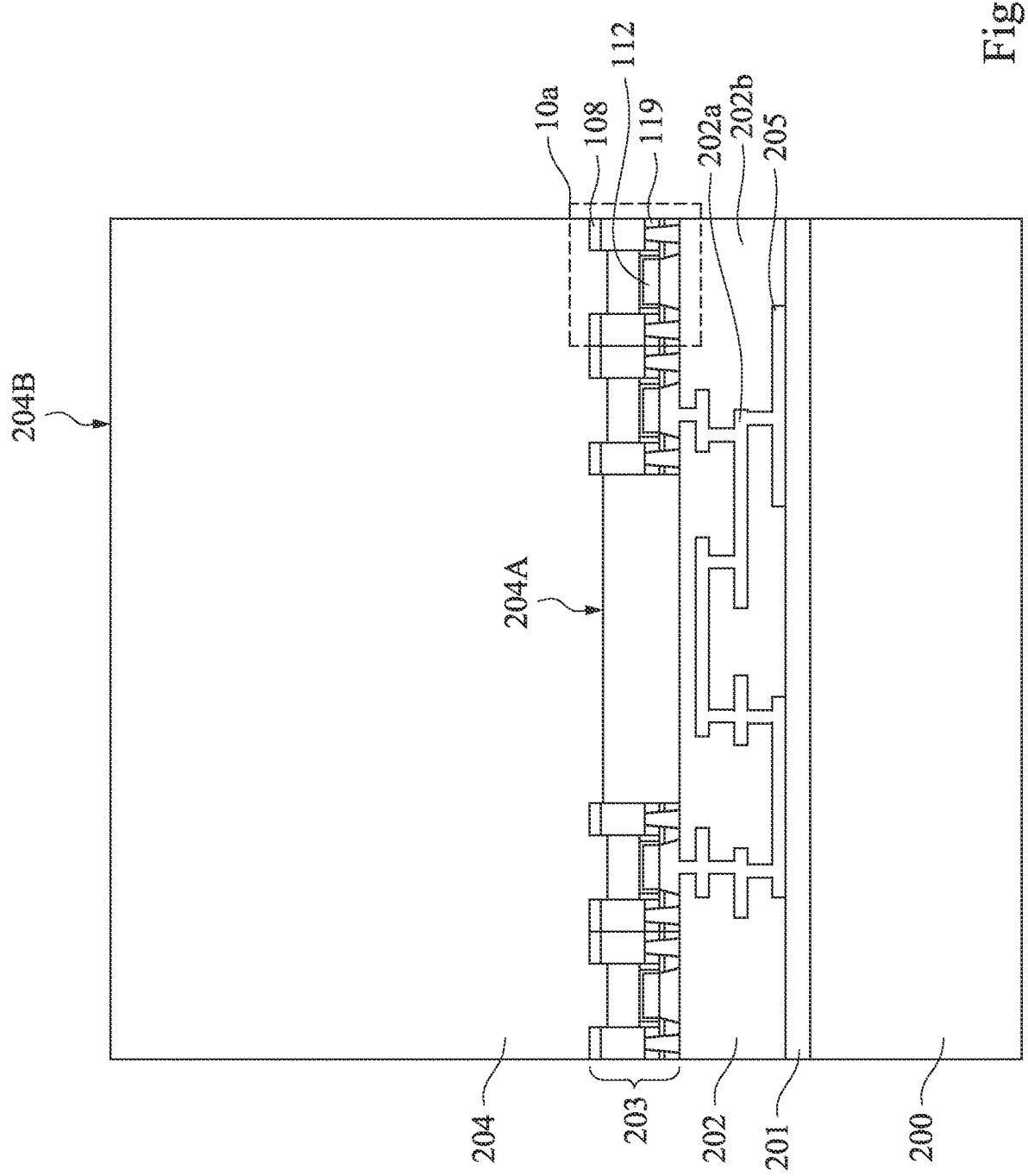
FIGS. 18-28 show cross-sectional representations of various stages of forming an integrated circuit structure in accordance with some embodiments of the disclosure.
Figure 19:
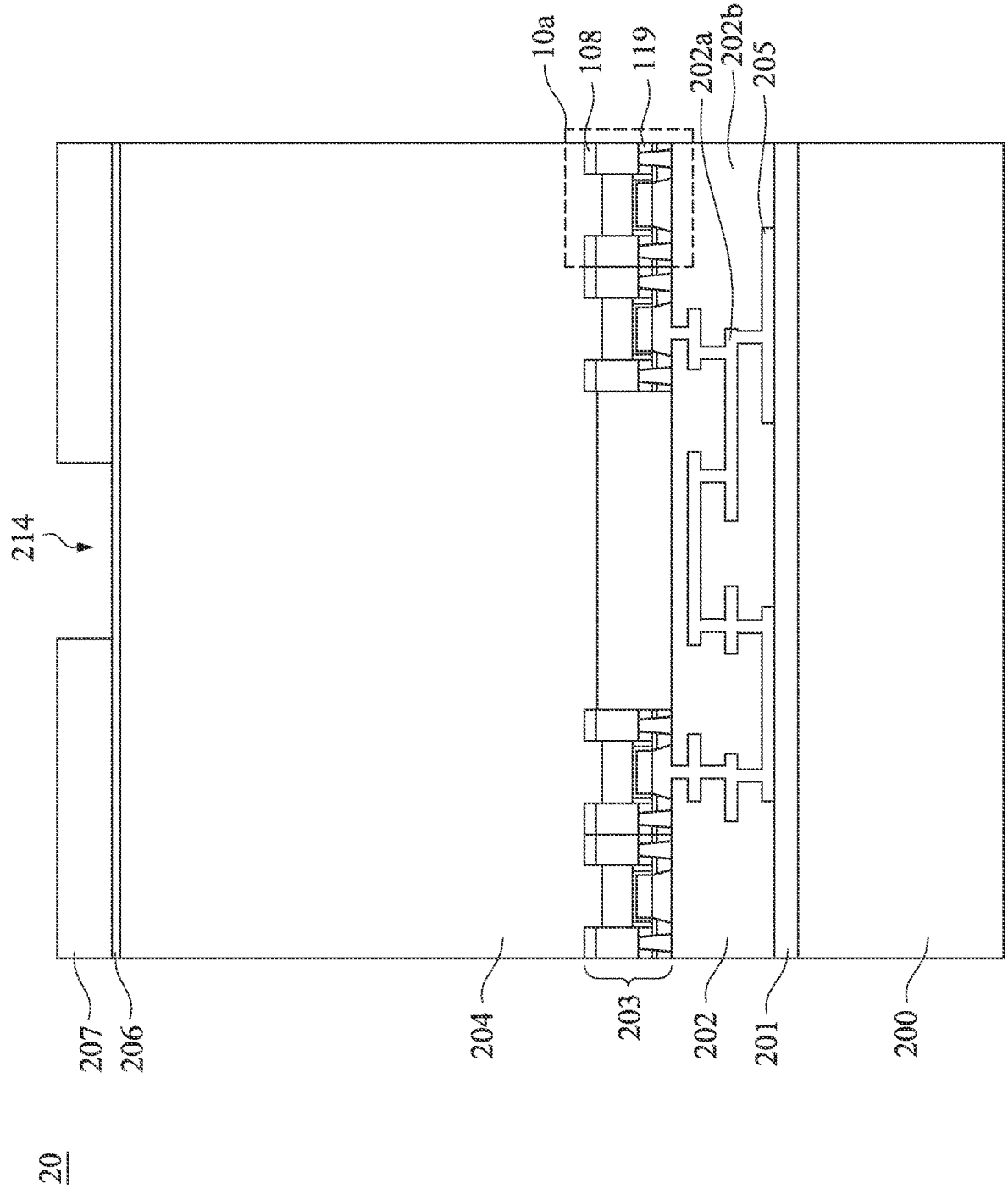

FIGS. 18-28 show cross-sectional representations of various stages of forming an integrated circuit structure 20 in accordance with some embodiments of the disclosure. Referring to FIG. 18, the integrated circuit structure 20 has a substrate 204 having a front-side 204A and a back-side 204B opposite to each other. The integrated circuit structure 20 includes a front-end-of line stack 203 and a back-end-of-line stack 202, which are both formed on the front-side 204A of the substrate 204. The front-end-of-line stack 203 includes one or more semiconductor devices 10a. Each of the semiconductor devices 10a is similar to the semiconductor device 10 in FIGS. 17A-17B, and the description thereof is omitted.

The back-end-of-line stack 202 may include interconnect structures electrically connected to conductive features (e.g., gate contacts 117 and source/drain contacts 118) of the semiconductor devices 10a. The interconnect structure includes conductive features 202a, such as conductive lines, vias, and at least one conductive pad 205, formed in an insulating material 202b. As shown in FIG. 18, devices, such as the semiconductor devices 10a including a metal gate 112, are formed in the front-side 204A of the substrate 204 while no devices are formed in the back-side 204B of substrate 204. The metal routings of the conductive features 202a shown in FIG. 18 are merely examples. Alternatively, other designs of metal routings of conductive features 202a may be used according to actual application.

As shown in FIG. 18, the integrated circuit structure 20 is turned upside down and bonded to a carrier substrate 200 through an adhesive layer 201, in accordance with some embodiments. As a result, the front-side 204A of the substrate 204 faces the carrier substrate 170. In some embodiments, the carrier substrate 200 is used as a temporary substrate. The temporary substrate provides mechanical and structural support during a subsequent thinning process, which will be described in more detail later. In this example, the carrier substrate 100 is silicon. In some other embodiments, the carrier substrate 200 is made of glass material, semiconductor material, ceramic material, polymer material, metal material, another suitable material, or a combination thereof.

In some embodiments, the adhesive layer 201 is used as a temporary adhesive layer. The adhesive layer 201 may be made of glue, or may be a lamination material, such as a foil. In some embodiments, the adhesive layer 201 is photosensitive and is easily detached from the carrier substrate 200 by light irradiation. For example, shining ultra-violet (UV) light or laser light on the carrier substrate 200 is used to detach the adhesive layer 201. In some embodiments, the adhesive layer 201 is a light-to-heat-conversion (LTHC) coating. In some other embodiments, the adhesive layer 201 is heat-sensitive and is easily detached from the carrier substrate 200 when it is exposed to heat.

Figure 20:
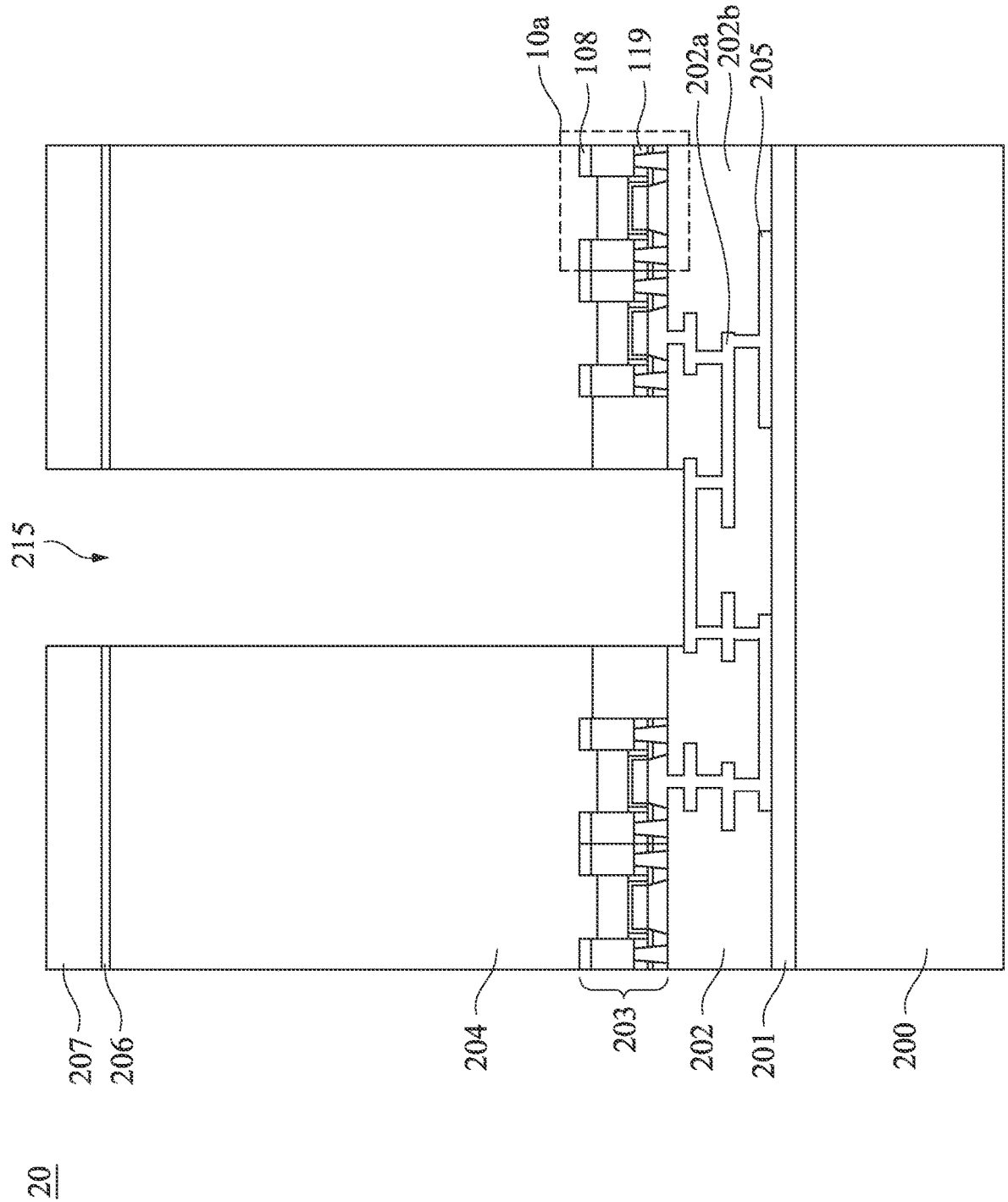

Afterwards, a mask layer 206 is formed on the substrate 204. In at least one embodiment, the mask layer 206 is formed of silicon nitride, for example, using low-pressure chemical vapor deposition (LPCVD) or plasma enhanced chemical vapor deposition (PECVD). The mask layer 206 is used as a hard mask during subsequent photolithography processes. A photo-sensitive layer 207 is formed on the mask layer 206 and is then patterned, forming an opening 214 in the photo-sensitive layer 207. The mask layer 206 is etched through the opening 214 to expose the underlying substrate 204. The exposed substrate 204 is then etched to form a through substrate via (TSV) opening 215. The resulting structure is shown in FIG. 20. A top portion of the back-end-of-line stack 202 is removed. The TSV opening 215 exposes sidewalls of the substrate 204 and a top of the back-end-of-line stack 202. In one example, the conductive features 202a are exposed by the TSV opening 215.

Figure 21:
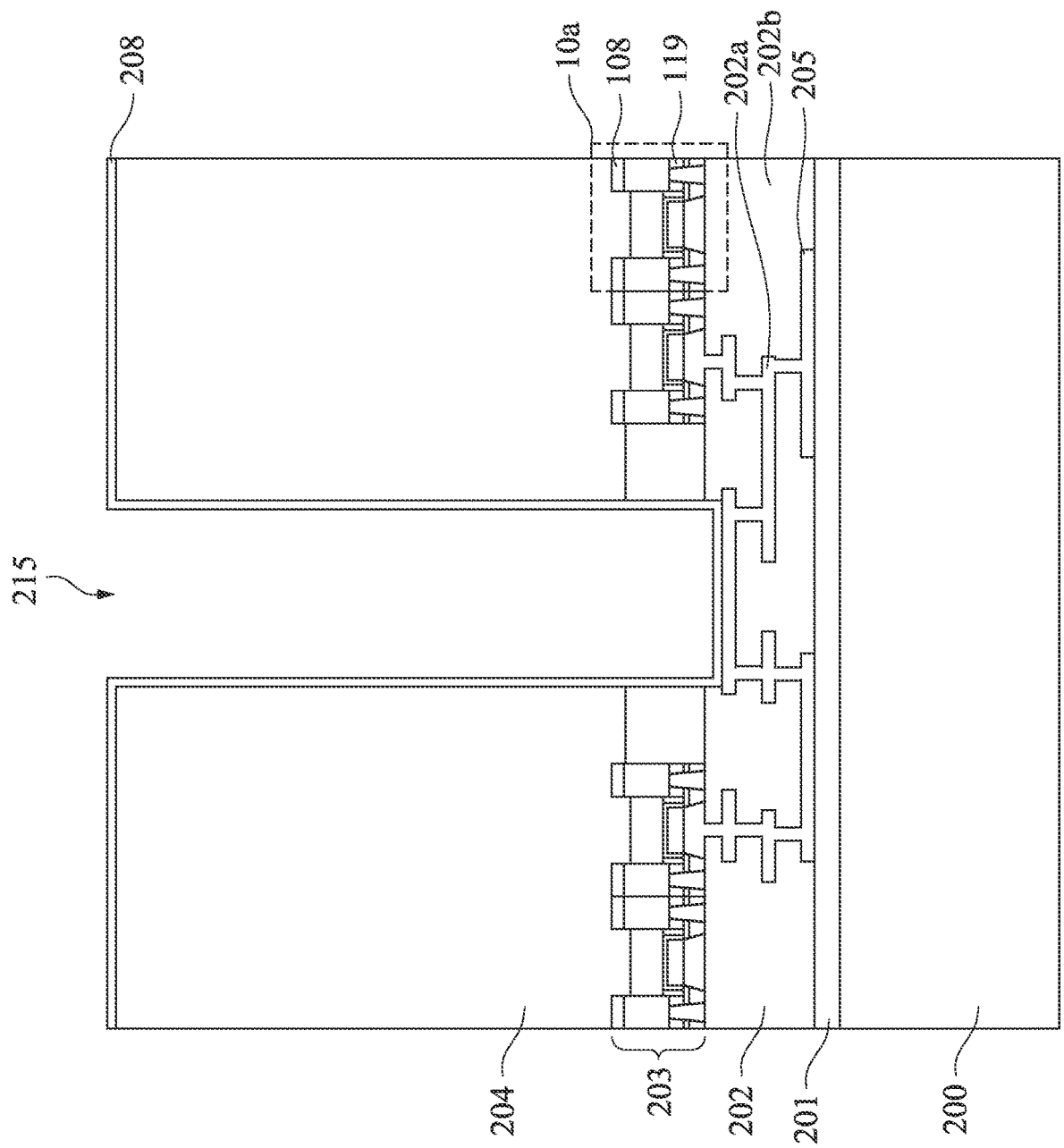

Next, the photo-sensitive layer 114 is then removed, such by an acceptable ashing process. The mask layer 206 is then removed by etch, as shown in FIG. 21. Reference is made to FIG. 21. A dielectric layer 208 is formed as a blanket layer to cover a surface and the sidewalls of the substrate 204 and the top of the back-end-of-line stack 202. In some embodiments, the dielectric layer 208 includes silicon oxide and can be formed by atomic layer deposition.

Figure 22:
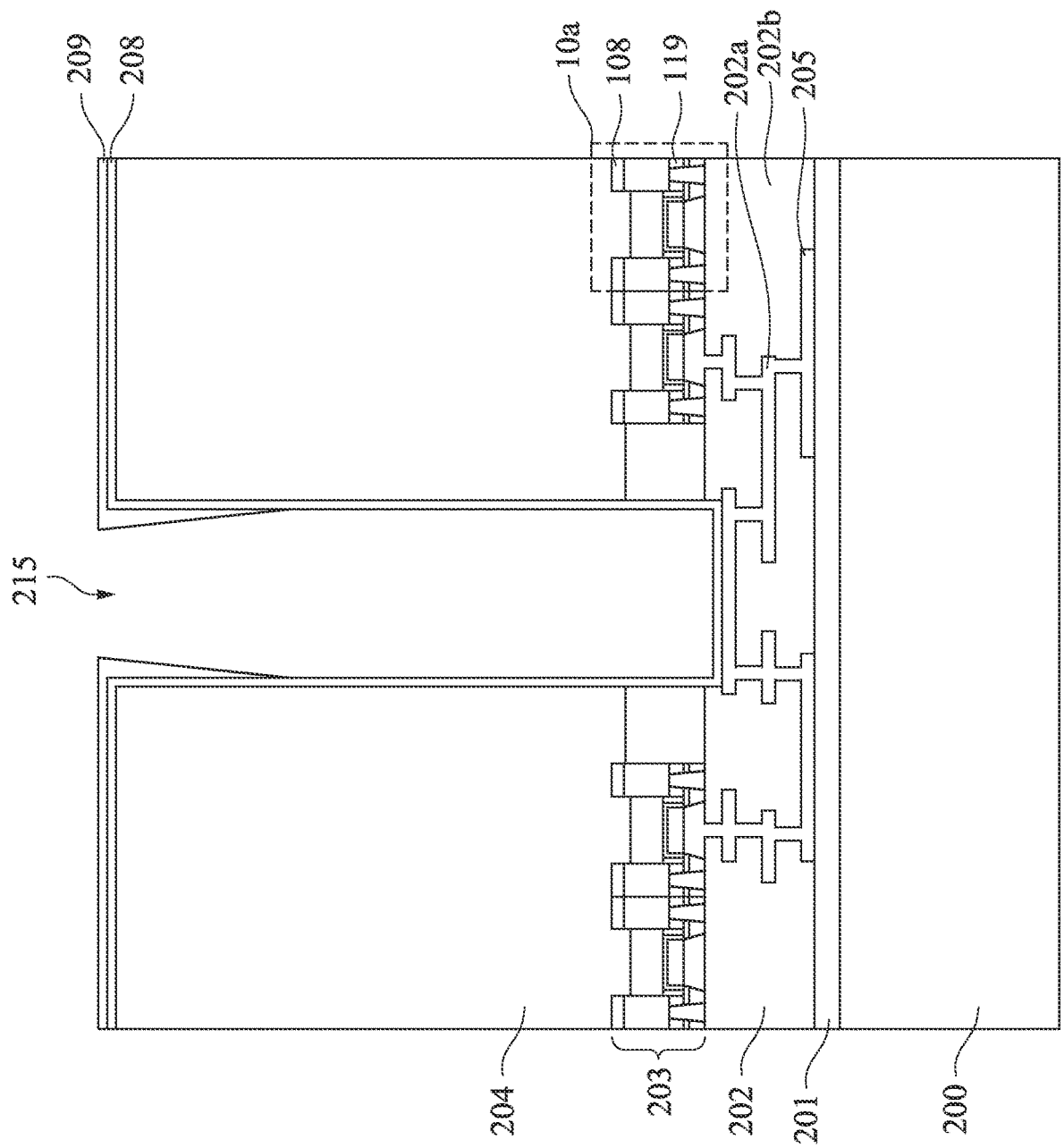

Referring to FIG. 22, an etch stop layer 209 is formed over the dielectric layer 208 using a non-conformal deposition method, for example, plasma enhanced chemical vapor deposition. The etch stop layer 209 and the dielectric layer 208 have different materials. In one example, the etch stop layer 209 can include silicon nitride. The etch stop layer 209 acts to stop a subsequent etch process at a desired interface.

Figure 23:
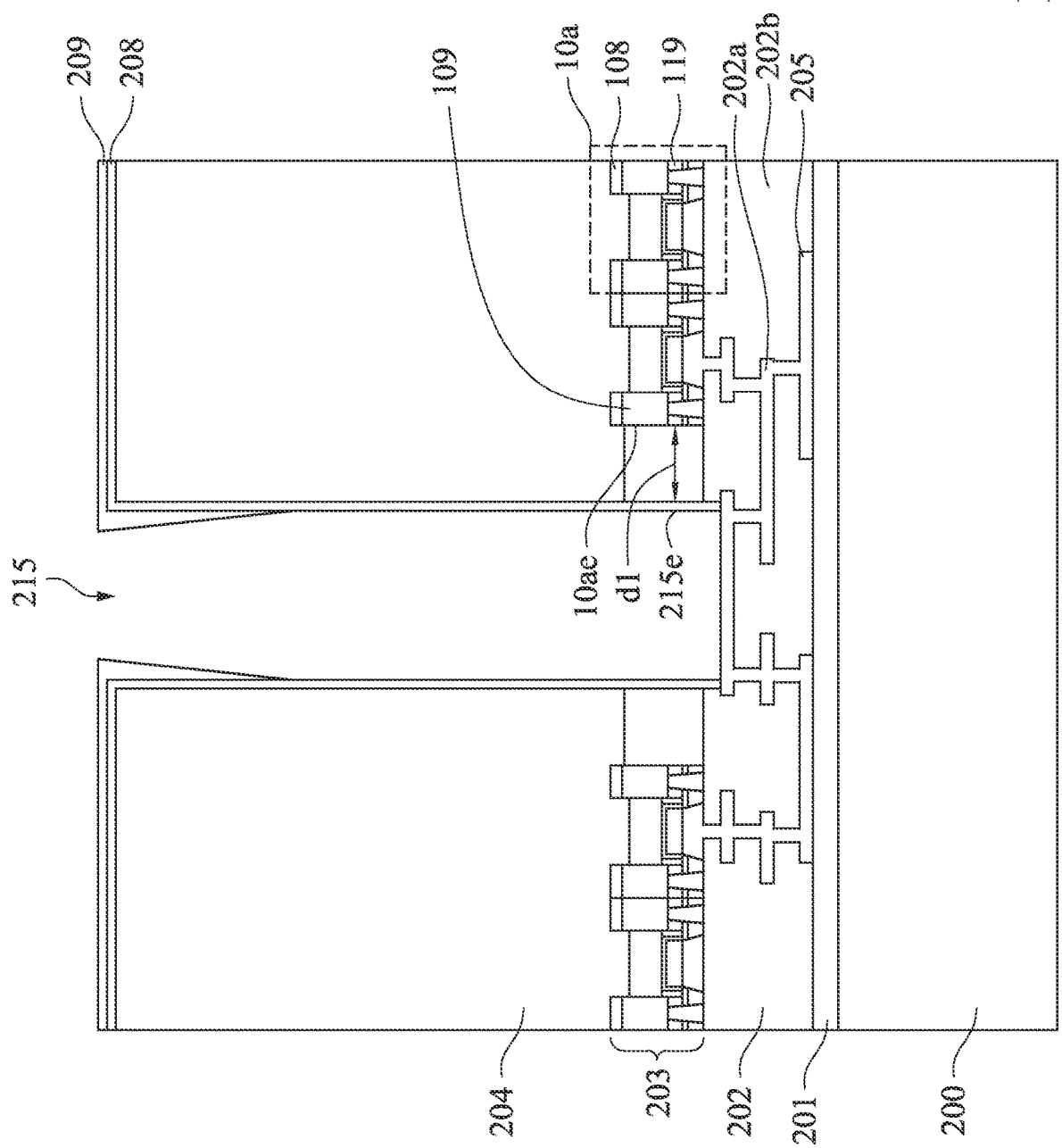

In FIG. 23, the dielectric layer 208 at the bottom of the TSV opening 215 is removed using an etch process to expose the top of back-end-of-line stack 202. One of the semiconductor devices 10a closest to the TSV opening 215 has an edge 10ae opposite to an edge 215e of the TSV opening 215. In an example, the edge 10ae refers to an edge of the epitaxy region 109. In some embodiments, a lateral distance d1 between the edges 215e, 10ae is from 0.1 μm to 100 μm, such as 1 μm. The distance d1 is controlled to ensure a sufficient space for a desired number of semiconductor devices be placed and avoid an unwanted stress applied to the semiconductor devices 10a. If the lateral distance d1 is lower than 0.1 μm, a subsequently formed TSV may affect device performance. If the lateral distance d1 is greater than 100 μm, the device density will decrease.

Figure 24:
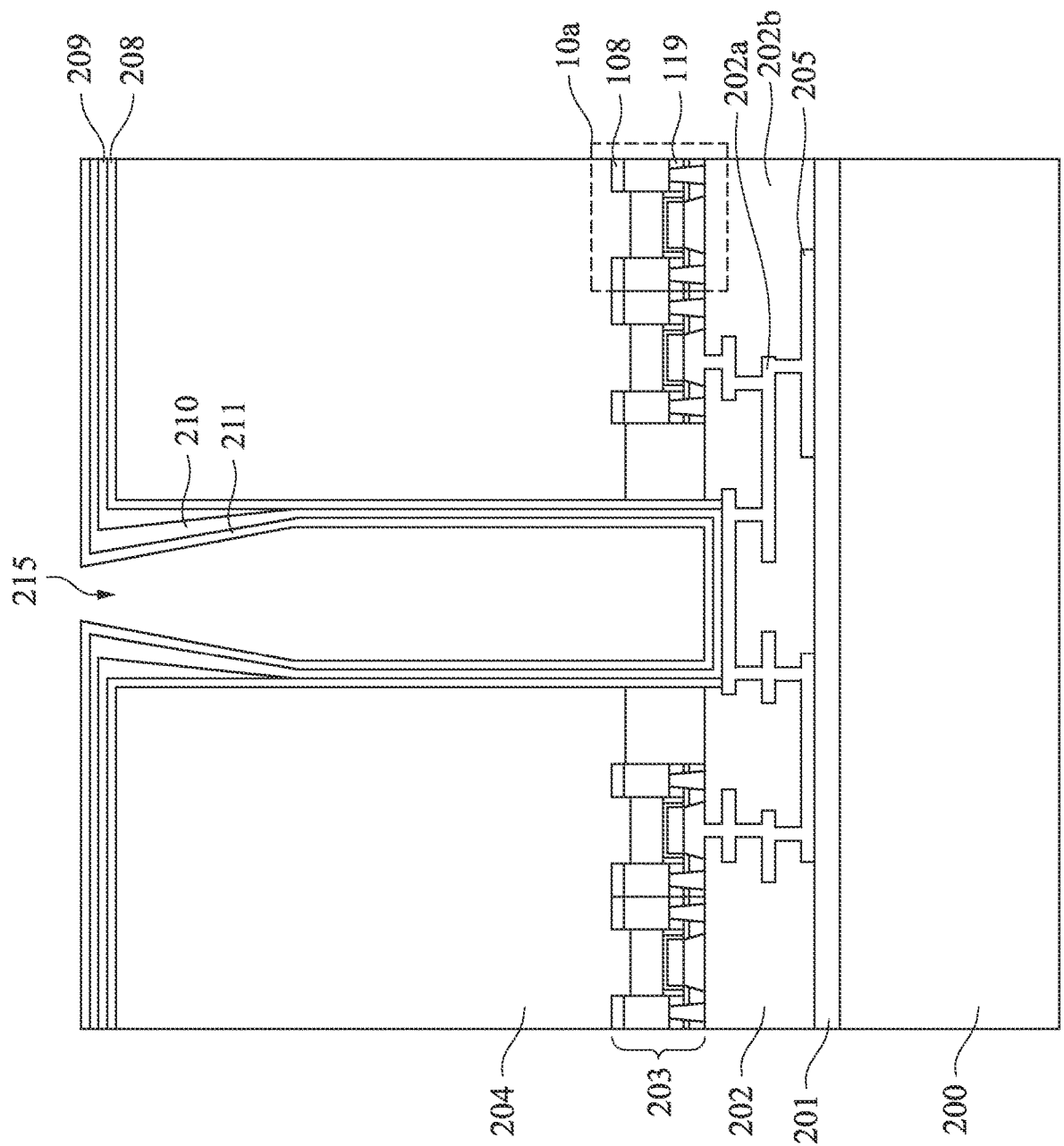

In FIG. 24, a diffusion barrier layer 210 is formed on sidewalls of the TSV opening 215 to act as an isolation layer, such that subsequently formed conductive materials of TSV and the substrate 204 do not directly contact with each other. The diffusion barrier layer 208 is conformally formed on the etch stop layer 209, the dielectric layer 208 and the top of the back-end-of-line stack 202 (e.g., on the bottom of the TSV opening 215). The diffusion barrier layer 210 is used to prevent conductive materials of the TSV, which will be formed later, from migrating to device regions (e.g., the front-end-of-line stack 203 and the back-end-of-line stack 202). After the diffusion barrier layer 210 is formed, a copper seed layer 211 is formed lining the diffusion barrier layer 210. In some embodiments, the diffusion barrier layer 210 is made of Ta, TaN, Ti, TiN or CoW. In some embodiments, diffusion barrier layer 210 is formed by a physically vapor deposition (PVD) process. In some embodiments, diffusion barrier layer 210 is formed by plating.

Figure 25:
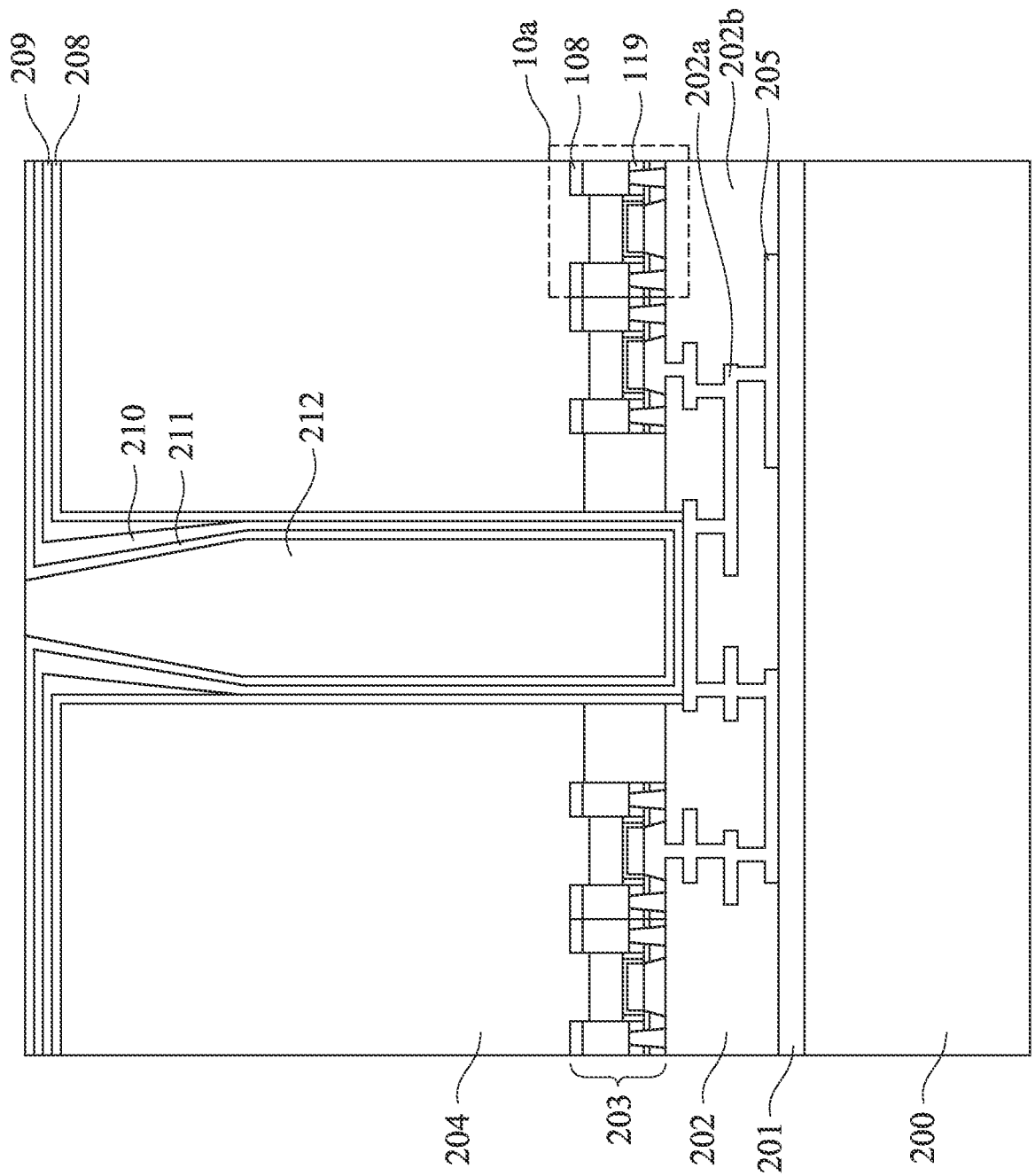

In FIG. 25, a conductive material 212 is formed to fill into the TSV opening 215 (see FIG. 24) using an electroplating process, such as an electrochemical deposition (ECD) process, or the like. In some embodiments, the conductive material 212 is made of copper, copper alloy, aluminum, aluminum alloys, or combinations thereof. Alternatively, other applicable materials may be used. The conductive material 212 can help heat generated by the source-to-drain current dissipate into the substrate 204. As mentioned above, the thermal conductive layers 108, 119 can help dissipate heat as well. As a result, the performance and reliability of integrated circuit structure 20 can be ensured.

Figure 26:
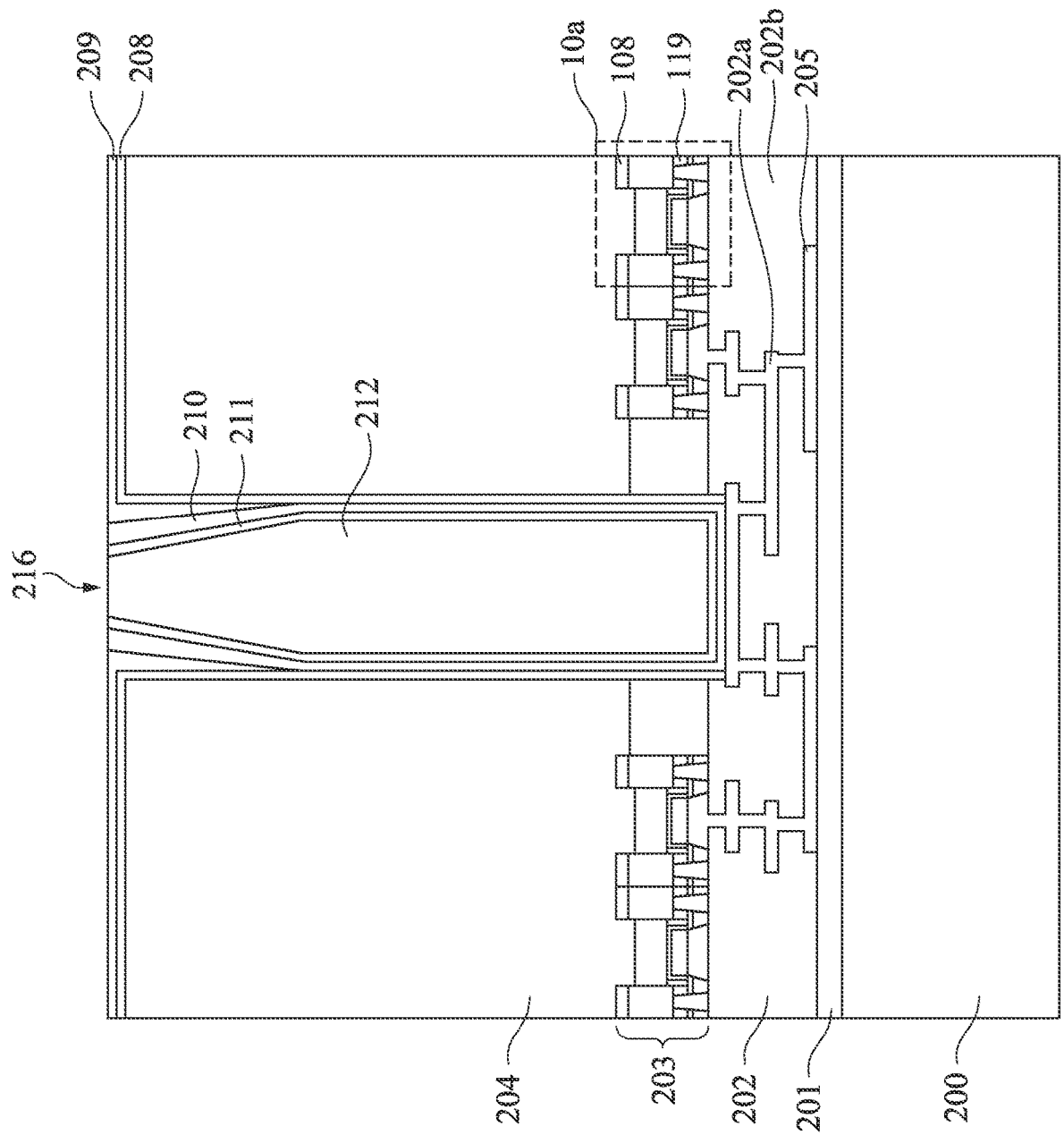

Afterwards, the excess diffusion barrier layer 210, seed layer 211 and conductive material 212 are removed by a planarization process, such as a chemical mechanical polishing (CMP) process, until the etch stop layer 209 is exposed. The resulting structure is shown in FIG. 26. The diffusion barrier layer 210, the seed layer 211 and the conductive material 212 collectively refer to a through substrate via (TSV) 216. The TSV 216 can help heat generated by the source-to-drain current dissipate into the substrate 204. As mentioned above, the thermal conductive layers 108, 119 can help dissipate heat as well. As a result, the performance and reliability of the integrated circuit structure 20 can be ensured.

Figure 27:
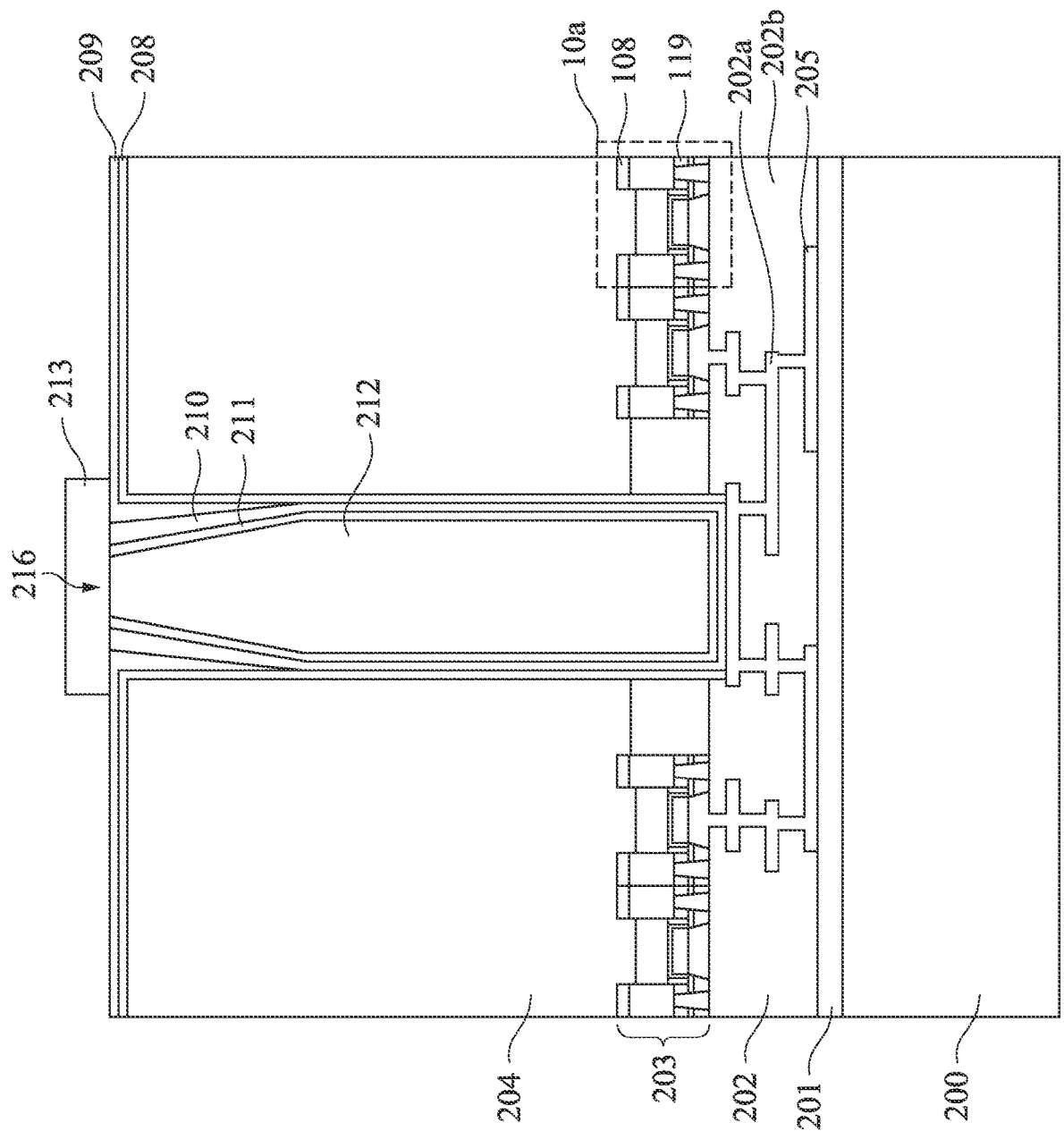

Referring to FIG. 27, subsequently, a redistribution layer (RDL) 213 is formed over the TSV 216, in accordance with some embodiments.

In some embodiments, the RDL 213 includes copper. Examples of the material of the RDL 213 include Cu, Al, W, titanium (Ti), tantalum (Ta), another suitable material, or a combination thereof. In some embodiments, the RDL 213 are formed by an electroplating process, an electroless plating process, a sputtering process, a CVD process, or another applicable process. In some other embodiments, the RDL 213 may include one or more passivation layers and one or more conductive layers. The RDL 213 may have solder balls (not shown) placed on to be electrically connect to external contact pads.

Figure 28:
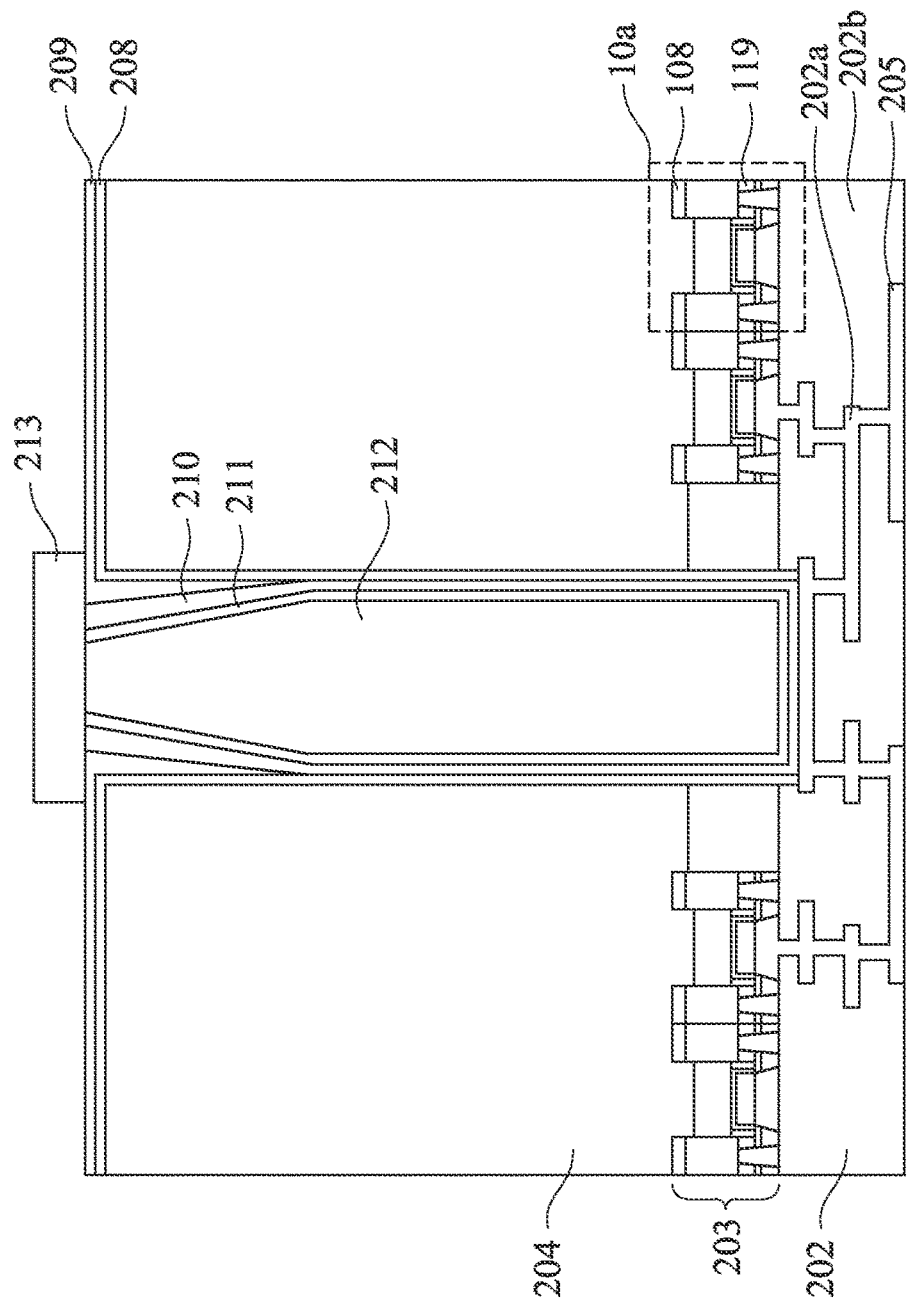

Afterwards, the carrier substrate 200 and the adhesive layer 201 are removed. Suitable light may be provided to remove the adhesive layer 201 so as to lift off the carrier substrate 200 as well. The resulting structure is shown in FIG. 28. The conductive pad 205 is exposed. The resulting integrated circuit structure 20 may then be bonded to other package component via the conductive pad 205.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that by using the thermal conductive layer, the heat generated by the source-to-drain current and/or the anneal process of forming the epitaxy regions can be dissipated into the substrate via the thermal conductive layer efficiently. Another advantage is that the thermal conductive layers can collectively surround the epitaxy regions to enhance heat dissipation into the substrate.

In some embodiments, a method of forming a semiconductor device includes forming a semiconductor strip extending above a semiconductor substrate, forming shallow trench isolation (STI) regions on opposite sides of the semiconductor strip, recessing a portion of the semiconductor strip, etching the STI regions to form a recess in the STI regions, forming a first thermal conductive layer in the recess, forming a source/drain epitaxy structure on the first thermal conductive layer, and forming a gate stack across the semiconductor strip and extending over the STI regions. In some embodiments, the first thermal conductive layer is made of BeO, AlN, or chemical vapor deposited diamond. In some embodiments, the first thermal conductive layer has a thermal conductivity of greater than 1.4 W/m·K. In some embodiments, forming the first thermal conductive layer comprises depositing a first thermal conductive material filling into the recess in the STI regions and etching back the first thermal conductive material. In some embodiments, forming the first thermal conductive layer further comprises forming a patterned photoresist over the etched back first thermal conductive material and etching the first thermal conductive material using the patterned photoresist as a mask. In some embodiments, the method further includes forming a second thermal conductive layer covering the source/drain epitaxy structure. In some embodiments, the second thermal conductive layer and the first thermal conductive layer collectively surround the source/drain epitaxy structure. In some embodiments, the second thermal conductive layer includes BeO, AlN, or chemical vapor deposited diamond.

In some embodiments, a method of forming a semiconductor device includes forming a semiconductor strip extending above a front-side of a semiconductor substrate, wherein the semiconductor substrate has a back-side opposite to the front-side, forming shallow trench isolation (STI) regions on opposite sides of the semiconductor strip, recessing a portion of the semiconductor strip, forming a dielectric layer on the recessed portion of the semiconductor strip, forming a source/drain epitaxy structure on dielectric layer, wherein the source/drain epitaxy structure is in contact with the dielectric layer, and forming a gate stack across the semiconductor strip and extending over the STI regions. In some embodiments, the dielectric layer has a thermal conductivity greater than a thermal conductivity of silicon oxide. In some embodiments, the recessed portion of the semiconductor strip is separated with the source/drain epitaxy structure by the dielectric layer. In some embodiments, the dielectric layer has a U-shaped profile when viewed from cross-section. In some embodiments, the method further includes after recessing a portion of the semiconductor strip, forming a mask layer on the STI regions, forming a patterned photoresist over the mask layer, and etching the STI regions using the mask layer and the patterned photoresist as an etch mask to form a recess in the STI regions. In some embodiments, forming the dielectric layer is performed using atomic layer deposition, chemical vapor deposition, or physical vapor deposition. In some embodiments, the method further includes forming a back-end-of-line (BEOL) stack on the front-side of the semiconductor substrate, wherein the BEOL stack is electrically connected to the gate stack or the source/drain epitaxy structure, and forming a through substrate via (TSV) penetrating from the back-side of the semiconductor substrate into the semiconductor substrate, wherein the TSV is electrically connected to the BEOL stack.

In some embodiments, a semiconductor device includes a semiconductor strip on a front-side of a semiconductor substrate, shallow trench isolation (STI) regions on the semiconductor substrate, a gate crossing the semiconductor strip, source/drain epitaxy structures on opposite sides of the gate, and a thermal conductive layer at least laterally surrounding a bottom of the source/drain epitaxy structure, wherein the thermal conductive layer has a thermal conductivity greater than 1.4 W/m·K. In some embodiments, the thermal conductive layer has a portion between the semiconductor strip and the source/drain epitaxy structures in a vertical direction. In some embodiments, the thermal conductive layer covers a top of the source/drain epitaxy structures. In some embodiments, the thermal conductive layer is BeO, AlN, or chemical vapor deposited diamond. In some embodiments, the semiconductor device further includes a back-end-of-line (BEOL) stack on a front-side of the semiconductor substrate and being electrically connected to the gate or the source/drain epitaxy structures, and a through-substrate via (TSV) penetrating through a back-side of the semiconductor substrate opposite to the front-side, wherein the TSV has a first edge opposite to a second edge of the source/drain epitaxy structures, and the first edge and the second edge have a lateral distance in a range from 0.1 µm to 100 µm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a semiconductor strip extending above a semiconductor substrate;
    forming shallow trench isolation (STI) regions on opposite sides of the semiconductor strip;
    recessing a portion of the semiconductor strip;
    etching the STI regions to form a recess in the STI regions;
    forming a first thermal conductive layer in the recess, wherein forming the first thermal conductive layer comprises:
        depositing a first thermal conductive material filling into the recess in the STI regions;
        etching back the first thermal conductive material;
        forming a patterned photoresist over the etched back first thermal conductive material; and
        etching the first thermal conductive material using the patterned photoresist as a mask;
    forming a source/drain epitaxy structure on the first thermal conductive layer; and
    forming a gate stack across the semiconductor strip and extending over the STI regions.

2. Method of claim 1, wherein the first thermal conductive layer is made of BeO, AlN, or chemical vapor deposited diamond.

3. The method of claim 1, wherein the first thermal conductive layer has a thermal conductivity of greater than 1.4 W/m·K.

4. The method of claim 1, further comprising:
    forming a second thermal conductive layer covering the source/drain epitaxy structure.

5. The method of claim 4, further comprising:
    forming a source/drain contact penetrating through the second thermal conductive layer to be in contact with the source/drain epitaxy structure.

6. The method of claim 4, wherein the second thermal conductive layer includes BeO, AlN, or chemical vapor deposited diamond.

7. The method of claim 4, wherein the second thermal conductive layer and the first thermal conductive layer collectively surround the source/drain epitaxy structure.

8. A method of forming a semiconductor device, comprising:
    forming a semiconductor strip extending above a front-side of a semiconductor substrate, wherein the semiconductor substrate has a back-side opposite to the front-side;
    forming shallow trench isolation (STI) regions on opposite sides of the semiconductor strip;
    recessing a portion of the semiconductor strip;
    after recessing the portion of the semiconductor strip, forming a mask layer on the STI regions;
    forming a patterned photoresist over the mask layer;
    etching the STI regions using the mask layer and the patterned photoresist as an etch mask to form a recess in the STI regions;
    forming a dielectric layer on the recessed portion of the semiconductor strip;
    forming a source/drain epitaxy structure on the dielectric layer, wherein the source/drain epitaxy structure is in contact with the dielectric layer; and
    forming a gate stack across the semiconductor strip and extending over the STI regions.

9. The method of claim 8, wherein the dielectric layer is in contact with opposite sidewalls of the source/drain epitaxy structure.

10. The method of claim 8, wherein the dielectric layer has a thermal conductivity greater than a thermal conductivity of silicon oxide.

11. The method of claim 8, wherein the recessed portion of the semiconductor strip is separated with the source/drain epitaxy structure by the dielectric layer.

12. The method of claim 8, wherein the dielectric layer has a U-shaped profile when viewed from cross-section.

13. The method of claim 8, wherein the dielectric layer is in contact with a top surface of the STI regions and a sidewall of the STI regions.

14. The method of claim 8, wherein forming the dielectric layer is performed using atomic layer deposition, chemical vapor deposition, or physical vapor deposition.

15. The method of claim 8, further comprising:
    forming a back-end-of-line (BEOL) stack on the front-side of the semiconductor substrate, wherein the BEOL stack is electrically connected to the gate stack or the source/drain epitaxy structure; and
    forming a through substrate via (TSV) penetrating from the back-side of the semiconductor substrate into the semiconductor substrate, wherein the TSV is electrically connected to the BEOL stack.

16. A method of forming a semiconductor device, comprising:
    forming a semiconductor strip on a front-side of a semiconductor substrate;
    forming shallow trench isolation (STI) regions on the semiconductor substrate;
    forming a gate crossing the semiconductor strip;
    forming a first thermal conductive layer over the semiconductor strip, wherein the first thermal conductive layer has a thermal conductivity greater than 1.4 W/m·K; and
    forming source/drain epitaxy structures on opposite sides of the gate, wherein the first thermal conductive layer laterally surrounds a bottom of the source/drain epitaxy structures;
    forming a back-end-of-line (BEOL) stack on a front-side of the semiconductor substrate and being electrically connected to the gate or the source/drain epitaxy structures; and
    forming a through-substrate via (TSV) penetrating through a back-side of the semiconductor substrate opposite to the front-side, wherein the TSV has a first edge opposite to a second edge of the source/drain epitaxy structures, and the first edge and the second edge have a lateral distance in a range from 0.1 μm to 100 μm.

17. The method of claim 16, wherein the first thermal conductive layer has a portion between the semiconductor strip and the source/drain epitaxy structures in a vertical direction.

18. The method of claim 16, further comprising:
    forming a second thermal conductive layer covering a top of the source/drain epitaxy structures.

19. The method of claim 16, wherein the first thermal conductive layer is BeO, AlN, or chemical vapor deposited diamond.

20. The method of claim 16, wherein the first thermal conductive layer has a top surface substantially coplanar with a top surface of the STI regions.

* * * * *